United States Patent
Qiu et al.

(10) Patent No.: US 12,469,832 B2
(45) Date of Patent: Nov. 11, 2025

(54) LIGHT-EMITTING PANEL AND DISPLAY DEVICE

(71) Applicants: Shanghai Tianma Microelectronics Co., Ltd., Shanghai (CN); Chengdu Tianma Microelectronics Co., Ltd., Sichuan (CN)

(72) Inventors: Pengfei Qiu, Shanghai (CN); Lihua Wang, Shanghai (CN)

(73) Assignees: Shanghai Tianma Microelectronics Co., Ltd., Shanghai (CN); Chengdu Tianma Microelectronics Co., Ltd., Chengdu (CN)

( * ) Notice: Subject to any disclaimer, the term of this patent is extended or adjusted under 35 U.S.C. 154(b) by 746 days.

(21) Appl. No.: 17/844,839

(22) Filed: Jun. 21, 2022

(65) Prior Publication Data
US 2022/0320060 A1   Oct. 6, 2022

(30) Foreign Application Priority Data
Mar. 11, 2022 (CN) .......................... 202210239031.7

(51) Int. Cl.
*H01L 25/16* (2023.01)
*G09G 3/32* (2016.01)
(Continued)

(52) U.S. Cl.
CPC ......... *H01L 25/167* (2013.01); *H10D 86/441* (2025.01); *H10D 86/60* (2025.01); *H10H 20/857* (2025.01); *G09G 3/32* (2013.01); *G09G 2300/0842* (2013.01); *G09G 2330/021* (2013.01); *H01L 24/05* (2013.01); *H01L 24/16* (2013.01); *H01L 2224/05567* (2013.01); *H01L 2224/05573* (2013.01); *H01L 2224/16147* (2013.01)

(58) Field of Classification Search
None
See application file for complete search history.

(56) References Cited

U.S. PATENT DOCUMENTS

2009/0315057 A1*  12/2009  Konishi ............. H10H 20/8581
                                                257/E33.061
2022/0375911 A1*  11/2022  Li ....................... H01L 25/0753

FOREIGN PATENT DOCUMENTS

CN          111524931 A        8/2020
CN          112782889 A        5/2021
(Continued)

Primary Examiner — Bo B Jang
(74) Attorney, Agent, or Firm — KDW Firm PLLC

(57) ABSTRACT

Provided are a light-emitting panel and a display device. The light-emitting panel includes a base substrate, a first reflective layer and multiple light-emitting elements, and at least one second reflective portion. The first reflective layer and the multiple light-emitting elements are located on the base substrate. The first reflective layer includes a first reflective portion and multiple hollow portions. The multiple light-emitting elements are located in the multiple hollow portions. A gap exists between each of the multiple light-emitting elements in each of the multiple hollow portions and the first reflective portion. The at least one second reflective portion is located between the base substrate and the first reflective layer. In a direction perpendicular to a plane where the base substrate is located, the at least one second reflective portion covers the gap.

18 Claims, 16 Drawing Sheets

(51) Int. Cl.
 *H01L 23/00* (2006.01)
 *H10D 86/40* (2025.01)
 *H10D 86/60* (2025.01)
 *H10H 20/857* (2025.01)

(56) References Cited

FOREIGN PATENT DOCUMENTS

| | | |
|---|---|---|
| CN | 113270437 A | 8/2021 |
| CN | 215896398 U | 2/2022 |

\* cited by examiner

LIGHT-EMITTING PANEL AND DISPLAY DEVICE

CROSS-REFERENCE TO RELATED APPLICATION

This application claims priority to Chinese Patent Application No. 202210239031.7 filed Mar. 11, 2022, the disclosure of which is incorporated herein by reference in its entirety.

TECHNICAL FIELD

The present disclosure relates to the field of display techniques and, in particular, to a light-emitting panel and a display device.

BACKGROUND

With the development of display technologies, requirements for display functions of a display device are getting higher and higher. A light-emitting panel with characteristics of good luminance, high light emission efficiency, a wide viewing angle range and self-illumination has become the focus of current research and application in the field of optoelectronic display.

The existing light-emitting panel uses light-emitting elements to emit light, and the light is emitted from a display light-emitting surface of the light-emitting panel. However, the light does not only propagate toward the display light-emitting surface of the light-emitting panel but also propagates in all directions. Therefore, in some application scenarios, the brightness of the display light-emitting surface of the light-emitting panel is insufficient; and when relatively high luminance is required, only a higher voltage or a larger current is provided so as to achieve the relatively high luminance, which is not conducive to the low power consumption of the light-emitting panel.

SUMMARY

The present disclosure provides a light-emitting panel and a display device, so as to improve a light utilization rate, improve display luminance of the light-emitting panel, and reduce power consumption of the light-emitting panel.

According to an aspect of the present disclosure, a light-emitting panel is provided and includes a base substrate, a first reflective layer and a plurality of light-emitting elements, and at least one second reflective portion.

The first reflective layer and the plurality of light-emitting elements are located on the base substrate, where the first reflective layer includes a first reflective portion and a plurality of hollow portions; the plurality of light-emitting elements are located in the plurality of hollow portions and a gap exists between the light-emitting elements in the hollow portion and the first reflective portion.

At least one second reflective portion is located between the base substrate and the first reflective layer, where in a direction perpendicular to a plane where the base substrate is located, the at least one second reflective portion covers the gap.

According to another aspect of the present disclosure, a display device is provided and includes the preceding light-emitting panel.

It is to be understood that the content described in this section is not intended to identify key or critical features of the embodiments of the present disclosure, nor is the content intended to limit the scope of the present disclosure. Other features of the present disclosure will become readily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below merely illustrate part of the embodiments of the present disclosure, and those of ordinary skill in the art may obtain other drawings based on the drawings on the premise that no creative work is done.

DETAILED DESCRIPTION

The technical solutions in the embodiments of the present disclosure will be described clearly and completely in conjunction with the drawings in the embodiments of the present disclosure from which the solutions of the present disclosure will be better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that terms "first", "second" and the like in the description, claims and drawings of the present disclosure are used for distinguishing between similar objects and are not necessarily used for describing a particular order or sequence. It is to be understood that the data used in this way is interchangeable where appropriate so that the embodiments of the present disclosure described herein may also be implemented in a sequence not illustrated or described herein. In addition, terms "comprising", "including" and any other variations thereof are intended to encompass a non-exclusive inclusion. For example, a process, method, system, product or device that includes a series of steps or units not only includes the expressly listed steps or units but may also include other steps or units that are not expressly listed or are inherent to such process, method, product or device.

Figure 1:
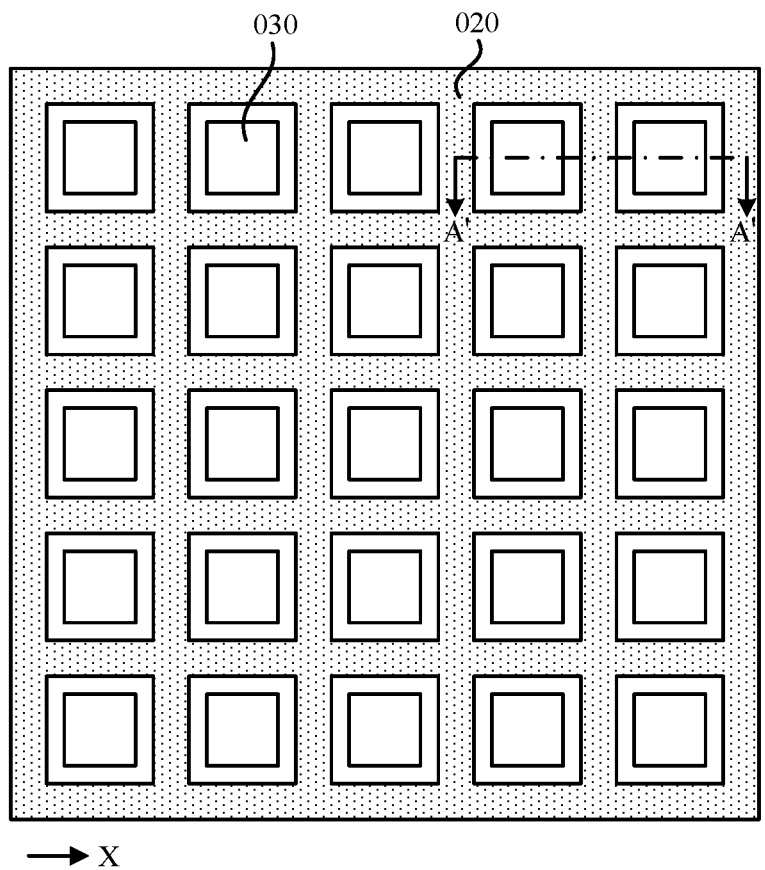
FIG. 1 is a top diagram of a light-emitting panel in the related art.
Figure 2:
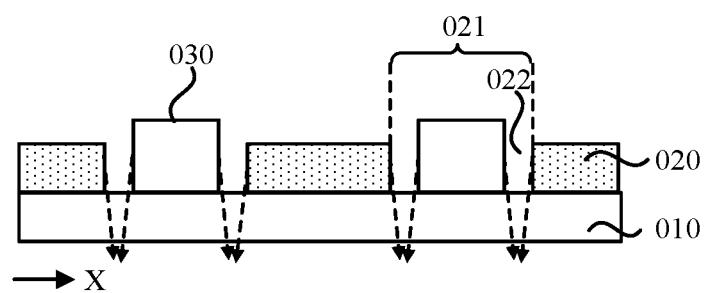
FIG. 2 is a sectional diagram taken along A-A' of FIG. 1.

As described in the BACKGROUND, the utilization rate of the light emitted by the light-emitting elements in the light-emitting panel is relatively low, and display light emission requirements of the light-emitting panel with high brightness and low power consumption cannot be satisfied. FIG. 1 is a top diagram of a light-emitting panel in the related art, and FIG. 2 is a sectional diagram taken along A-A' of FIG. 1. Referring to FIGS. 1 and 2, the light-emitting panel includes a substrate 010 and an ink layer 020 located on the substrate, an opening structure 021 is disposed on the ink layer 020, and a light-emitting element 030 is located in the opening structure 021. Since the ink layer 020 has a certain reflective capability, light emitted from a side of the light-emitting element 030 located in the opening structure 021 on the ink layer 020 can be reflected and reused, so as to improve the light utilization rate.

However, to facilitate the setting of the light-emitting element 030, for example, in the case where the light-emitting element 030 is a mini light-emitting diode (mini-LED) or a micro light-emitting diode (micro-LED), since the light-emitting element 030 needs to be bonded with a pad (not shown in the figure) on the substrate 010, if the ink material on the ink layer 020 is too close to the light-emitting element 030, a die attach process of the light-emitting element 030 and the pad during bonding is affected. To ensure the bonding accuracy and stability of the light-emitting element 030 and the pad, a dimension of the opening structure 021 is generally greater than a dimension of the light-emitting element 030 in a direction X parallel to a plane where the substrate 010 is located so that a gap 022 exists between the light-emitting element 030 and a reflective portion with a reflective function in the ink layer 020, and the light leaks out from the gap 022. Moreover, generally, the larger the gap 022 is, the more light leaks so that the light emitted by the light-emitting element 030 cannot be utilized efficiently. When relatively high display illuminance is needed, a higher display light emission signal is provided to the light-emitting element 030 so as to achieve the relatively high display illuminance. Moreover, the higher the display light emission signal provided to the light-emitting element 030 is, the power consumption is, which is not conducive to reducing the power consumption of the light-emitting panel.

To solve the preceding technical problem, an embodiment of the present disclosure provides a light-emitting panel. The light-emitting panel includes a base substrate, a first reflective layer and multiple light-emitting elements, and at least one second reflective portion. The first reflective layer and the multiple light-emitting elements are located on the base substrate. The first reflective layer includes a first reflective portion and multiple hollow portions. The multiple light-emitting elements are located in the multiple hollow portions. A gap exists between the light-emitting element in the hollow portion and the first reflective portion. The at least one second reflective portion is located between the base substrate and the first reflective layer. In a direction perpendicular to a plane where the base substrate is located, the at least one second reflective portion covers the gap.

In the preceding technical solutions, the light-emitting elements are disposed in the hollow portions of the first reflective layer so that the first reflective portion of the first reflective layer surrounds the light-emitting elements, and the first reflective portion is used for reflecting part of light, which is then reused. At the same time, the second reflective portion is disposed between the first reflective layer and the base substrate and covers at least the gap between the light-emitting element and the first reflective portion so that the second reflective portion can reflect the light that leaks out from the gap between the light-emitting element and the first reflective portion, thereby reusing this part of light. In the embodiments of the present disclosure, a loss rate of light emitted by the light-emitting elements can be reduced, and a utilization rate of the light emitted by the light-emitting elements is improved, thereby relatively improving display luminance of the light-emitting panel and a display light emission effect of the light-emitting panel. Compared with the case where a higher display signal is provided to the light-emitting elements so as to improve the luminance, when a light utilization rate of the light-emitting elements are improved, a relatively high display signal does not need to be improved so as to enable the light-emitting panel to have corresponding display luminance, which is conducive to reducing the power consumption of the light-emitting panel.

The above is the core concept of the present disclosure, and the technical solutions in the embodiments of the present disclosure are described clearly and completely hereinafter in conjunction with the drawings in the embodiments of the present disclosure. Based on the embodiments of the present disclosure, all other embodiments obtained by those of ordinary skill in the art without creative work are within the protection scope of the present disclosure.

Figure 3:
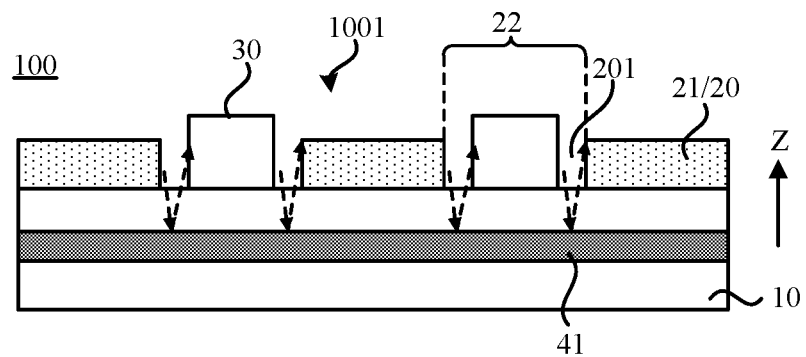
FIG. 3 is a structural diagram of a film layer of a light-emitting panel according to an embodiment of the present disclosure.
Figure 4:
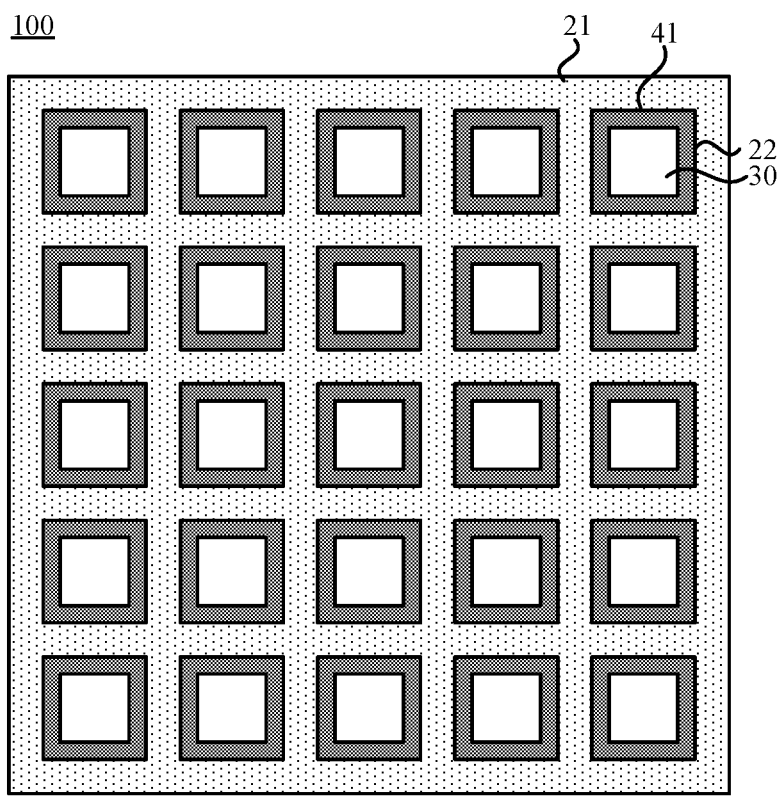
FIG. 4 is a top diagram of a light-emitting panel according to an embodiment of the present disclosure.

FIG. 3 is a structural diagram of a film layer of a light-emitting panel according to an embodiment of the present disclosure, and FIG. 4 is a top diagram of a light-emitting panel according to an embodiment of the present disclosure. Referring to FIGS. 3 and 4, a light-emitting panel 100 includes a base substrate 10, and a first reflective layer 20 and multiple light-emitting elements 30 that are located on the base substrate 10, where the first reflective layer 20 includes a first reflective portion 21 and multiple hollow portions 22, and the light-emitting elements 30 are located in the hollow portions 22. The first reflective layer 20 is a film layer with a certain reflective capability so that when the light emitted by the light-emitting elements 30 located in the hollow portions 22 reaches the first reflective portion 21, the first reflective portion 21 can reflect this part of light, and this part of light can be reused.

It is to be understood that FIG. 3 is only an exemplary drawing of an embodiment of the present disclosure, and by way of example, FIG. 3 only shows that a surface of a side of the light-emitting element 30 facing away from the base substrate 10 is higher than a surface of a side of the first reflective layer 20 facing away from the base substrate 10. In the embodiment of the present disclosure, the surface of the side of the light-emitting element facing away from the base substrate may also be lower than the surface of the side of the first reflective layer facing away from the base substrate, or the surface of the side of the light-emitting element facing away from the base substrate is flush with the surface of the side of the first reflective layer facing away from the base substrate, which is not specifically limited in the embodiments of the present disclosure.

Figure 5:
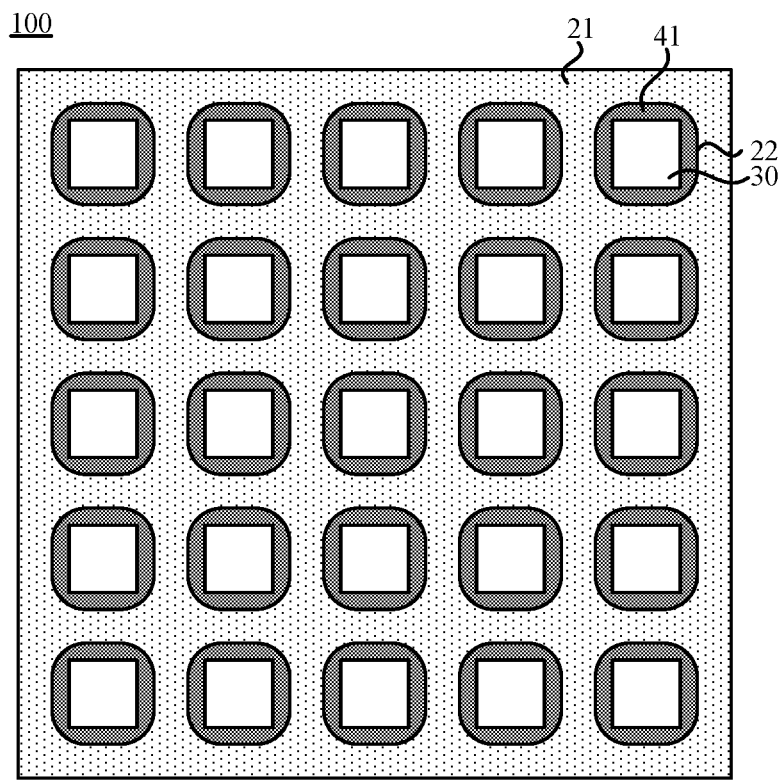
FIG. 5 is a top diagram of another light-emitting panel according to an embodiment of the present disclosure.

As shown in FIG. 4, a shape of an orthographic projection of the hollow portion 22 on the base substrate 10 may be the same as a shape of an orthographic projection of the light-emitting element 30 on the base substrate 10. For example, both shapes may be rectangular structures or regular and irregular shapes such as circles, ovals, and triangles. In an embodiment, as shown in FIG. 5, the shape of the orthographic projection of the hollow portion 22 on the base substrate 10 may also be different from the shape of the orthographic projection of the light-emitting element 30 on the base substrate 10. For example, the orthographic projection of the hollow portion on the base substrate 10 is a rounded rectangle, a circle, an ellipse or other structures, and the orthographic projection of the light-emitting element on the base substrate 10 is a rectangle, a triangle, a diamond or other structures, which is not specifically limited in the embodiments of the present disclosure. For ease of description, unless otherwise specified, in the embodiments of the present disclosure, the case where the shape of the orthographic projection of the hollow portion 22 on the base substrate 10 is the same as the shape of the orthographic projection of the light-emitting element 30 on the base substrate 10 is used as an example for the exemplary description of the technical solutions in the embodiments of the present disclosure.

In the embodiments of the present disclosure, to satisfy the design requirements of the light-emitting panel 100, a gap 201 exists between the light-emitting element 30 located in the hollow portion 22 and the first reflective portion 21. In this case, part of the light emitted by the light-emitting element 30 and part of the light reflected by the first reflective portion 21 is emitted from the gap 201 toward the side of the base substrate 10. Generally, a display light-emitting surface 1001 of the light-emitting panel 100 is the side of the light-emitting element 30 facing away from the base substrate 10 so that when part of the light is emitted from the gap 201 toward the side of the base substrate 10, this part of light cannot reach the display light-emitting surface 1001 of the light-emitting panel 100 and thus cannot contribute to display luminance of the display light-emitting surface 1001 of the light-emitting panel 100, which is not conducive to improving the light utilization rate, and the requirements of the light-emitting panel 100 for high display luminance cannot be satisfied, which is not conducive to reducing the power consumption of the light-emitting panel 100.

With continued reference to FIGS. 3 and 4, at least one second reflective portion 41 is disposed between the base substrate 10 and the first reflective layer 20; in a direction Z perpendicular to a plane where the base substrate 10 is located, the second reflective portion 41 covers the gap 201 so that when the light propagating from the gap 201 toward the side of the base substrate 10 reaches the second reflective portion 41, the second reflective portion 41 can reflect this part of light, and thus the reflected light of this part of light can propagate toward a side facing away from the base substrate 10 and reach the display light-emitting surface 1001 of the light-emitting panel 100. In this manner, this part of light is reused, thereby reducing the loss rate of light, improving the light utilization rate, satisfying the requirements of the light-emitting panel 100 for high display luminance, and improving the display light emission effect of the light-emitting panel 100. At the same time, when the light utilization rate is improved, a relatively small display light emission signal may be provided so as to satisfy the requirements of the light-emitting panel 100 for relatively high display luminance, which is conducive to reducing the power consumption of the light-emitting panel 100.

In an embodiment, both the first reflective layer 20 and the second reflective portion 41 may have relatively high reflective capabilities. By way of example, the first reflective layer 20 may include white ink. In this case, the first reflective layer 20 may be formed on the base substrate 10 around the light-emitting elements 20 by spraying or printing, or after a whole layer of the first reflective layer 20 is coated or printed, the first reflective layer 20 is patterned so as to form corresponding hollow portions 22 and the first reflective portion 21. In this manner, the light-emitting elements 30 are disposed in the hollow portions 22 in a subsequent manufacturing process, thereby satisfying display light emission requirements of the light-emitting elements 30.

It is to be understood that the material of the second reflective portion 41 may be the same as or different from the material of the first reflective layer. In an optional embodiment, the material of the second reflective portion 41 may include a metal material with high reflectivity such as silver and/or aluminum so that the second reflective portion 41 may be prepared on the same production line as the existing metal film layer in the light-emitting panel 100, which is conducive to simplifying the manufacturing process of the light-emitting panel 100 and reducing the manufacturing costs of the light-emitting panel 100.

In the embodiments of the present disclosure, the light-emitting element 30 may include, but is not limited to, an organic light-emitting diode (OLED), a micro-LED, a mini-LED, lamp beads of the LED and the like. In some optional embodiments, the light-emitting element 30 is preferably a mini-LED with a dimension ranging from 50 μm to 200 nm so that the light-emitting panel 100 has a relatively high resolution.

It is to be understood that the light-emitting panel 100 may be a display panel that directly displays a corresponding image; the light-emitting panel 100 may also be used for providing a backlight source for other display modules (such as a liquid crystal display module), and in this case, the light-emitting panel 100 is a component of a backlight module. The embodiments of the present disclosure do not specifically limit the function and type of the light-emitting panel 100.

It is to be noted that, as shown in FIG. 3, the light-emitting elements 30 may be arranged in a one-to-one correspondence with the hollow portions 22, that is, each hollow portion 22 is provided with one light-emitting element 30. In this case, the first reflective portion 21 not only can reflect part of the light emitted by the light-emitting elements 30 but also is used for separating two adjacent light-emitting elements 30, so as to prevent crosstalk between light emitted by the two adjacent light-emitting elements 30.

Figure 6:
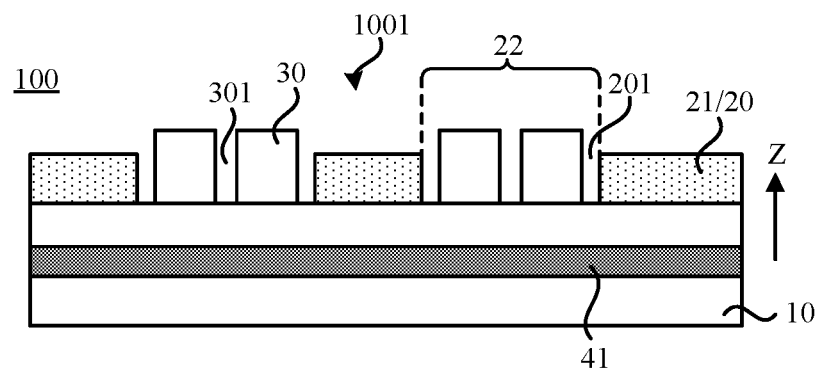
FIG. 6 is a structural diagram of a film layer of another light-emitting panel according to an embodiment of the present disclosure.

In an optional embodiment, as shown in FIG. 6, each hollow portion 22 may also be provided with two or more light-emitting elements 30, and the light-emitting elements 30 located in the same hollow portion 22 may have same or different light emission colors, which is not specifically limited in the embodiments of the present disclosure. At the same time, without considering the problem of light crosstalk between the light emitted by two adjacent light-emitting elements 30, a corresponding light-blocking structure may not be provided in a gap 301 between two adjacent light-emitting elements 30 located in the same hollow portion 22. In this case, to improve the light utilization rate, in the direction Z perpendicular to the plane where the base substrate 10 is located, the second reflective portion 41 may also cover the gap 301 between two adjacent light-emitting elements 30 in the same hollow portion 22.

Figure 7:
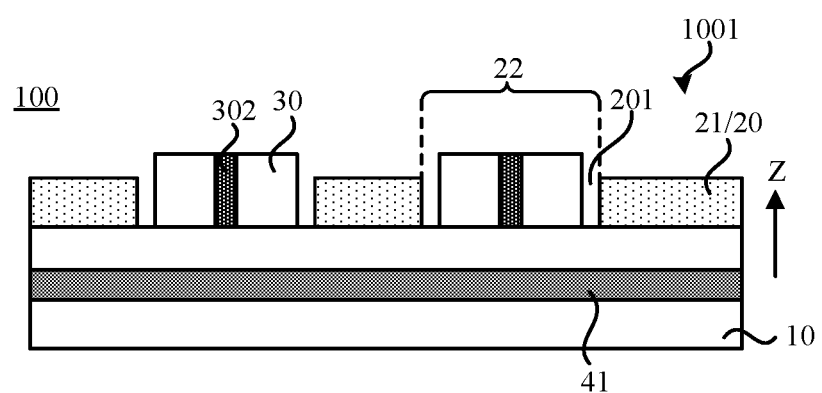
FIG. 7 is a structural diagram of a film layer of another light-emitting panel according to an embodiment of the present disclosure.

In an embodiment, as shown in FIG. 7, in the case where the problem of light crosstalk between two adjacent light-emitting elements 30 located in the same hollow portion needs to be considered, it is also feasible that a corresponding light-blocking structure 302 is filled in the gap between two adjacent light-emitting elements 30 in the same hollow portion 22 so that the light emitted by the light-emitting element 30 cannot pass through the light-blocking structure 302 to reach the other light-emitting element 30. The light-blocking structure 30 may include a light absorbing material and/or a reflective material, which is not specifically limited in the embodiments of the present disclosure.

For ease of description, unless otherwise specified, in the embodiments of the present disclosure, a case shown in FIG. 3 where each hollow portion 22 is provided with one light-emitting element 30 is used as an example for the exemplary description of the technical solutions in the embodiments of the present disclosure.

Figure 8:
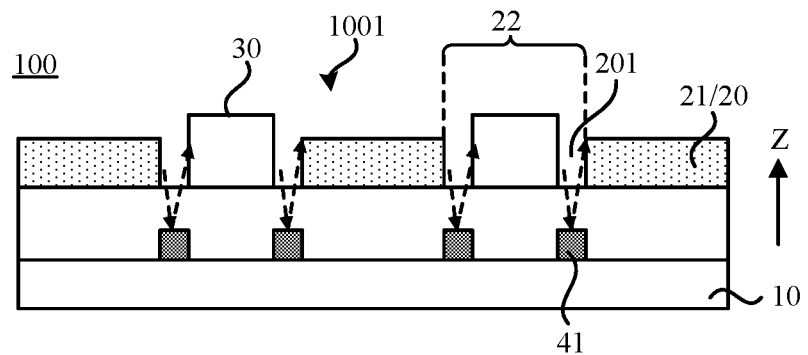
FIG. 8 is a structural diagram of a film layer of another light-emitting panel according to an embodiment of the present disclosure.

It is to be understood that, as shown in FIG. 3, in the direction Z perpendicular to the plane where the base substrate 10 is located, the second reflective portion 41 covering different gaps 201 may have an integrated structure, and the integrated structure may exist as a whole-surface structure. In an embodiment, as shown in FIG. 8, on the premise that the second reflective portion 41 is a structure, a corresponding opening may be provided in the second reflective portion 41, and in the direction Z perpendicular to the plane where the base substrate 10 is located, the opening and the gap 201 do not overlap each other. In this case, compared with the whole-surface second reflective portion 41, the opening is disposed in the second reflective portion 41 so that since no film layer material of the second reflective portion 41 exists at a position of the opening, the position of the opening of the second reflective portion 41 has less pressure or even no pressure on film layers below the second reflective portion 41. In this case, due to the pressure on the second reflective portion 41, the stress generated at each position of other film layers (such as the base substrate) below the second reflective portion 41 is relatively small, which is conducive to reducing the stress applied by the second reflective portion 41 to other film layers below the second reflective portion 41. At the same time, when the second reflective portion 41 is made of metal or other conductive materials, compared with the case where the second reflective portion 41 is a whole-surface structure, the opening in the second reflective portion 41 can reduce an area of an orthographic projection of a conductive structure in the second reflective portion 41 on the base substrate 10, thereby reducing the amount of charge accumulated on the second reflective portion 41 due to static electricity generated in the manufacturing process (production, assembly, testing, storage, transportation and other processes) of the light-emitting panel 100. In this manner, when a corresponding electrostatic discharge path is formed, the effect of the static electricity on each device and structure in the light-emitting panel 100 can be reduced, which is conducive to improving the production yield and service life of the light-emitting panel 100.

In an optional embodiment, referring to FIGS. 4 and 8, the light-emitting panel 100 may include multiple second reflective portions 41 corresponding to multiple hollow portions 22, where two adjacent second reflective portions 41 are not connected to each other.

In this manner, two adjacent second reflective portions 41 is not connected each other so that each second reflective portion 41 exists as an independent block structure between the base substrate 10 and the first reflective layer 20. In this case, a region between the two adjacent second reflective portions 41 does not generate corresponding pressure on other film layers (for example, the base substrate 10) below the second reflective portions, which is conducive to reducing the pressure on other film layers below the film layer where the second reflective portions 41 are located. At the same time, since the second reflective portions 41 are independent of each other, an area of an orthographic projection of each second reflective portion 41 on the base substrate 10 is relatively small so that the amount of charge accumulated on each second reflective portion 41 due to static electricity is relatively small. In this manner, when a corresponding electrostatic discharge path is formed, the effect of the static electricity on each device and structure in the light-emitting panel 100 can be reduced, which is conducive to improving the production yield and service life of the light-emitting panel 100.

In an embodiment, referring to FIGS. 4 and 8, each second reflective portion 41 may be arranged in a one-to-one correspondence with each hollow portion 22, that is, each hollow portion 22 corresponds to one second reflective portion 41. In this case, in the direction Z perpendicular to the plane where the base substrate 10 is located, each hollow portion 22 only overlaps one second reflective portion 41.

Figure 9:
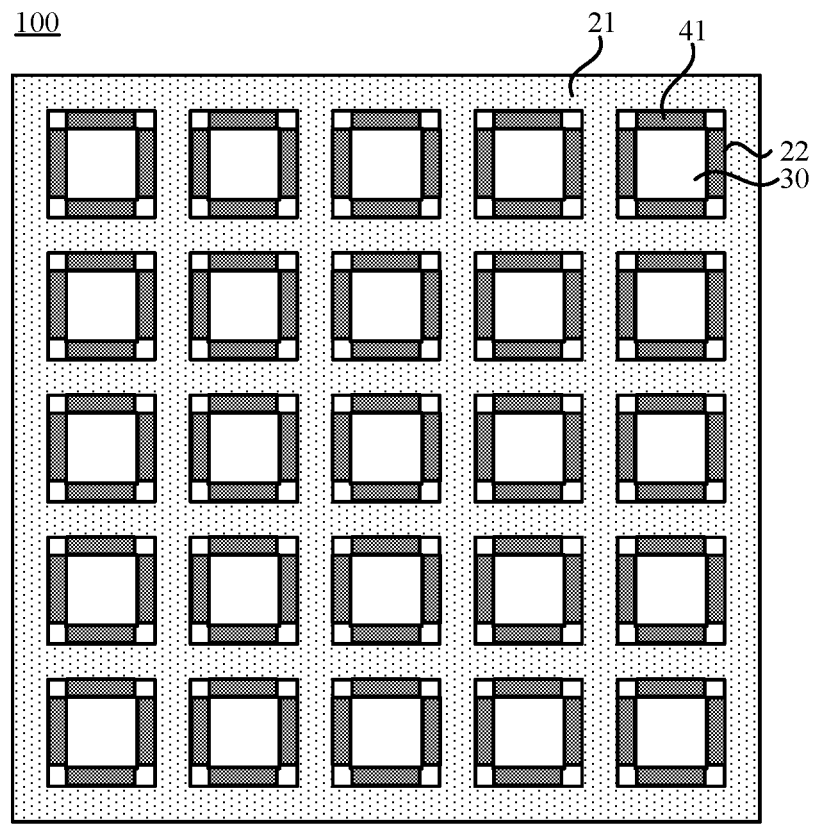
FIG. 9 is a top diagram of another light-emitting panel according to an embodiment of the present disclosure.

In an embodiment, referring to FIGS. 8 and 9, each hollow portion 22 may correspond to multiple second reflective portions 41. In this case, in the direction Z perpendicular to the plane where the base substrate 10 is located, each hollow portion 22 overlaps multiple second reflective portions 41, and each second reflective portion 41 overlapping with the same hollow portion 22 may be disposed around the light-emitting element 30 in the hollow portion.

In an optional embodiment, multiple hollow portions may also correspond to one second reflective portion. In this case, in the direction perpendicular to the plane where the base substrate is located, each second reflective portion overlaps multiple hollow portions.

The above is only an exemplary description of a corresponding relationship between the hollow portion 22 and the second reflective portion 41. In the embodiments of the present disclosure, the corresponding relationship between the hollow portion 22 and the second reflective portion includes but is not limited to the above. For ease of description, unless otherwise specified, in the embodiments of the present disclosure, a case where each second reflective portion 41 is arranged in a one-to-one correspondence with each hollow portion 22 is used as an example for the exemplary description of the technical solutions in the embodiments of the present disclosure.

It is to be noted that, by way of example, FIGS. 4 and 8 only shows that in the direction Z perpendicular to the plane where the base substrate 10 is located, the second reflective portion 41 only covers the gap 201 and does not overlap the light-emitting element 30 and the first reflective portion 21. However, in the embodiments of the present disclosure, the structure of the second reflective portion 41 is not limited to this.

In an embodiment, in the direction perpendicular to the plane where the base substrate is located, the second reflective portion further overlaps the light-emitting elements and/or the first reflective portion on both sides of the gap.

Figure 10:
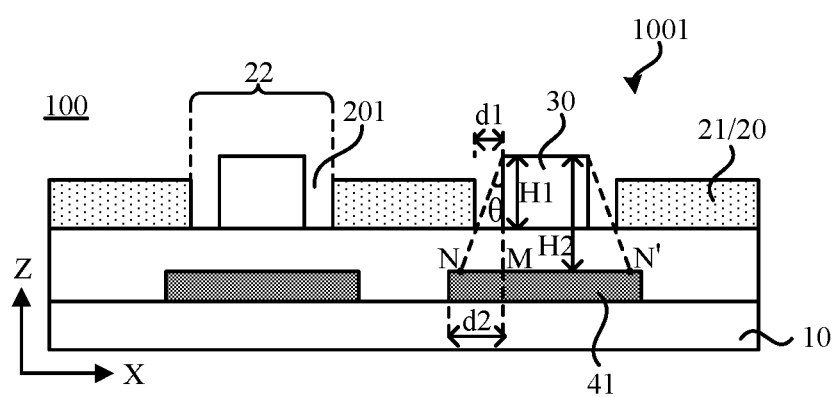
FIG. 10 is a structural diagram of a film layer of another light-emitting panel according to an embodiment of the present disclosure.
Figure 11:
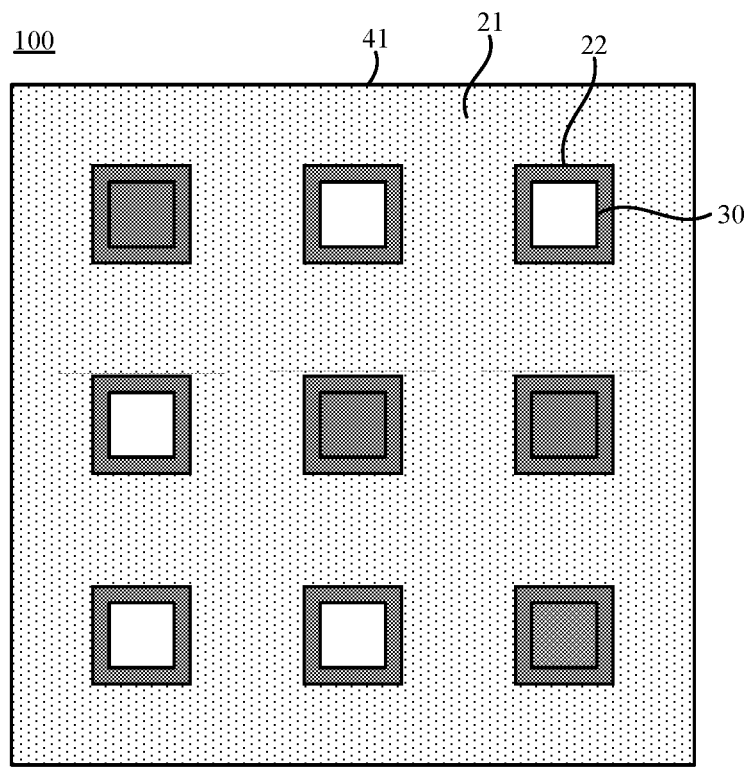
FIG. 11 is a top diagram of another light-emitting panel according to an embodiment of the present disclosure.

In an embodiment, FIG. 10 is a structural diagram of a film layer of another light-emitting panel according to an embodiment of the present disclosure, and FIG. 11 is a top diagram of another light-emitting panel according to an embodiment of the present disclosure. Referring to FIGS. 10 and 11, the case where the second reflective portion 21 overlaps the light-emitting elements 30 and the first reflective portion on both sides of the gap at the same time is used as an example. In this case, the second reflective portion 41 can not only reflect the light propagating to an orthographic projection of the gap on the film layer where the second reflective portion 41 is located but also reflect the light propagating to a periphery of the orthographic projection of the gap 201 on the film layer where the second reflective portion is located, and at the same time, the second reflective portion 41 can reflect at least part of the light emitted toward a side of the light-emitting element 30 facing toward the base substrate 10 so that the light emitted by the light-emitting elements 30 is utilized efficiently and the utilization rate of the light emitted by the light-emitting elements 30 is improved, which is conducive to improving the display luminance of the light-emitting panel 100 and reducing the power consumption of the light-emitting panel 100.

Figure 12:
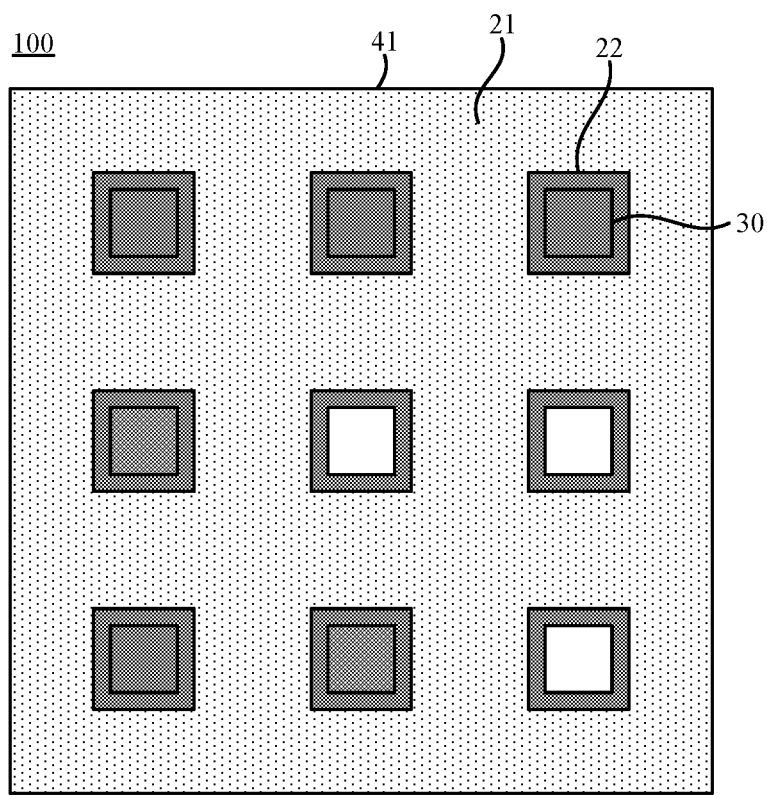
FIG. 12 is a top diagram of another light-emitting panel according to an embodiment of the present disclosure.

A shape of an orthographic projection of the second reflective portion 41 on the base substrate 10 may be consistent with a shape of an orthographic projection of the light-emitting element 30 and/or an opening structure 22 on the base substrate 10. For example, orthographic projections of the second reflective portion 41, the light-emitting element 30 and the opening structure 22 on the base substrate 10 are all rectangles. In an optional embodiment, as shown in FIG. 12, the shape of the orthographic projection of the second reflective portion 41 on the base substrate 10 may also be different from the shape of the orthographic projection of the light-emitting element 30 and/or the opening structure 22 on the base substrate 10. For example, the shape of the orthographic projection of the light-emitting element 30 and/or the opening structure 22 on the base substrate 10 is a rectangle, and the shape of the orthographic projection of the second reflective portion 41 is a circle, an ellipse and the like, which is not specifically limited in the embodiments of the present disclosure.

Figure 13:
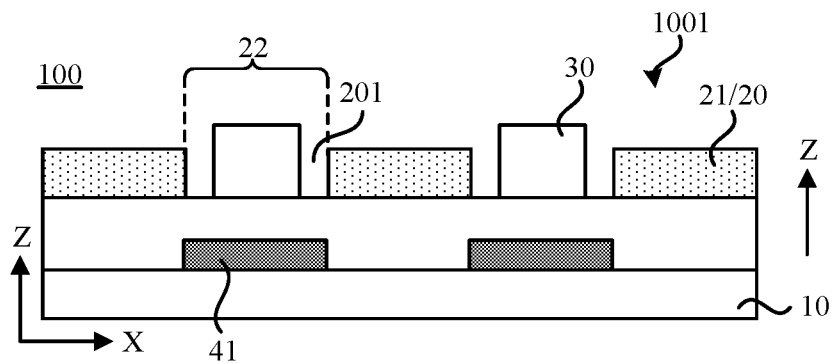
FIG. 13 is a structural diagram of a film layer of another light-emitting panel according to an embodiment of the present disclosure.
Figure 14:
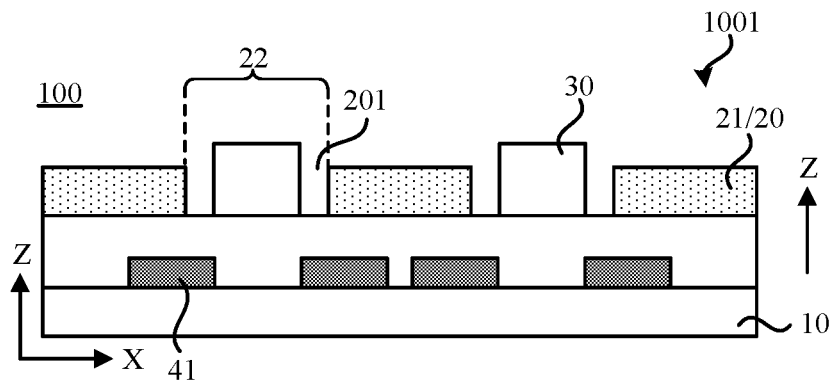
FIG. 14 is a structural diagram of a film layer of another light-emitting panel according to an embodiment of the present disclosure.

It is to be noted that in the direction Z perpendicular to the plane where the base substrate is located, on the basis that the second reflective portion 41 covers the gap 201, by way of example, FIGS. 10 and 11 only show that the second reflective portion 41 further overlaps the light-emitting elements 30 and the first reflective portion on both sides of the gap at the same time. In an optional embodiment of the present disclosure, as shown in FIG. 13, in the direction Z perpendicular to the plane where the base substrate is located, the second reflective portion 41 may only overlap the light-emitting element 30 on one side of the gap. In an embodiment, as shown in FIG. 14, in the direction Z perpendicular to the plane where the base substrate is located, the second reflective portion 41 may only overlap the first reflective portion 21 on one side of the gap. The embodiments of the present disclosure do not specifically limit this. For ease of description, unless otherwise specified, in the embodiments of the present disclosure, the case where in the direction Z perpendicular to the plane where the base substrate is located, on the basis that the second reflective portion 41 covers the gap 201, the second reflective portion 41 further overlaps the light-emitting elements 30 and the first reflective portion on both sides of the gap at the same time is used as an example for the exemplary description of the technical solutions in the embodiments of the present disclosure.

In an embodiment, with continued reference to FIG. 10, a height of the light-emitting element 30 in the direction perpendicular to the plane where the base substrate 10 is located is H1, and a minimum width of the gap between the light-emitting element 30 and the first reflective layer 20 along a first direction X is d1; a distance between a surface of a side of the second reflective portion 41 facing away from the base substrate 10 and a surface of a side of the light-emitting element 30 facing away from the base substrate 10 is H2; the first direction X is parallel to the plane where the base substrate 10 is located; where along the first direction X, a shortest distance d2 between the light-emitting element 30 and an edge of the second reflective portion 41 is at least $(d1/H1)*H2$.

In an embodiment, in a cross section in a schematic diagram of a film layer shown in FIG. 10, a diagonal of the gap 201, a bottom edge on a side of the gap 201 closer to the base substrate 10, and a sidewall of the light-emitting element 30 forms a triangle; and a diagonal extension line of the gap 201, an upper surface of the side of the second reflective portion 41 facing away from the base substrate 10, and an extension line of the sidewall of the light-emitting element 30 form a second triangle. Intersection points of diagonal extension lines of gaps 201 on two opposite sides of the light-emitting element 30 and the upper surface of the second reflective portion 41 are N and N', and an intersection point of the extension line of the sidewall of the light-emitting element 30 and the upper surface of the second reflective portion 41 is M. In this case, according to the triangle similarity principle, the following may be known: $\tan\theta = d1/H1 = Lmn/H2$, where Lmn denotes a distance between M and N in the first direction X. In this case, the following may be known: $Lmn=(d1/H1)*H2$. Since a maximum coverage region after the light that leaks out from the gap 201 and reaches the upper surface of the second reflective portion 41 is a region N-N', and the region N-N' may be regarded as a circular region with a distance between N and N' as a diameter in the top diagram of the light-emitting panel. To ensure that the second reflective portion 41 can fully reflect the light that leaks out from the gap 201, the shortest distance d2 between the light-emitting element 30 and the edge of the second reflective portion 41 is at least Lmn, that is, d2 is greater than or equal to $(d1/H1)*H2$, thereby improving the light utilization rate to the most extent.

Figure 15:
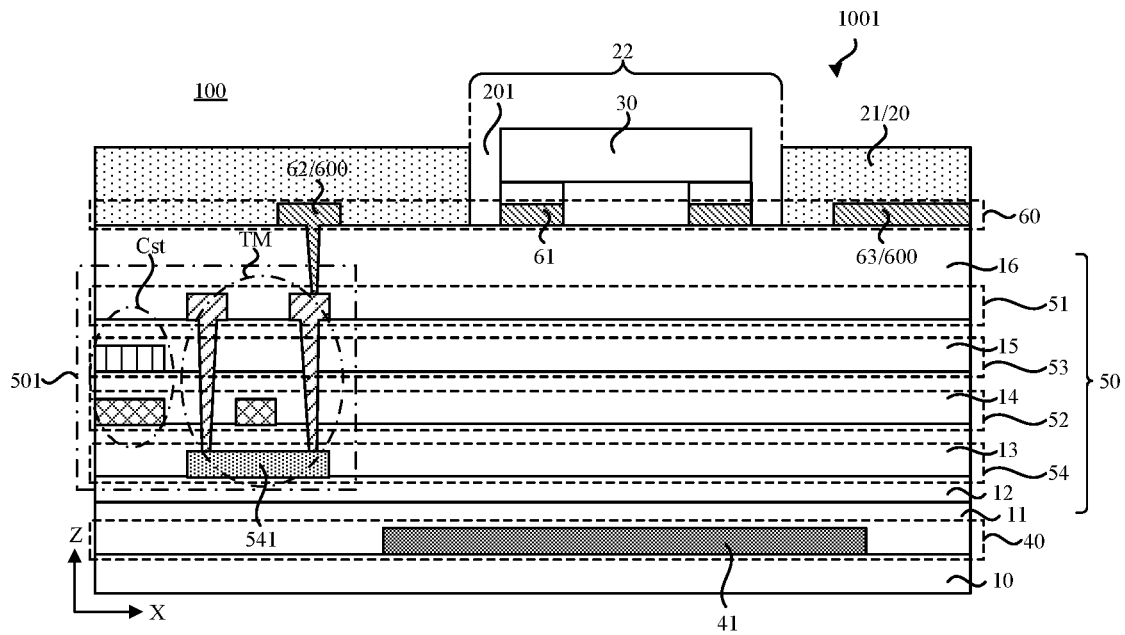
FIG. 15 is a structural diagram of a film layer of another light-emitting panel according to an embodiment of the present disclosure.

In an embodiment, FIG. 15 is a structural diagram of a film layer of another light-emitting panel according to an embodiment of the present disclosure. As shown in FIG. 15, the light-emitting panel 100 further includes a driver circuit layer 50 located between the base substrate 10 and the light-emitting elements 30, where the driver circuit layer 50 includes multiple driver circuits 501; and the driver circuits 501 are electrically connected to the light-emitting elements 30 and configured to drive the light-emitting elements 30 to emit light. In the case where the light-emitting panel 100 is a display panel that can directly display a corresponding image, different driver circuits 501 provide different display light emission signals for different light-emitting elements 30 or light-emitting elements 30 in different regions so that different light-emitting elements 30 or the light-emitting elements 30 in different regions have different display luminance. Light emitted by the light-emitting elements 30 with different colors and different display luminance is transmitted to the display light-emitting surface 1001 of the light-emitting panel 100 so that the display light-emitting surface 1001 of the light-emitting panel 100 presents a colorful picture. In the case where the light-emitting panel 100 is a component of a backlight module for providing a backlight source for other display modules, different driver circuits 501 provide display light emission signals for different light-emitting elements 30 or light-emitting elements 30 in different regions, and different light-emitting elements 30 or the light-emitting elements 30 in different regions are controlled to present different display luminance, so as to achieve a local dimming function of the backlight module.

It is to be noted that by way of example, FIG. 15 only shows part of the structure of the driver circuit 501 (a transistor TM and a storage capacitor Cst), and the structure of the driver circuit in the embodiments of the present disclosure is not limited to this, that is, the driver circuit 501 may be formed by any active and/or passive device that satisfy the design requirements. The active device includes, for example, a transistor. The passive device includes, for example, a resistor, a capacitor, and an inductor.

Figure 16:
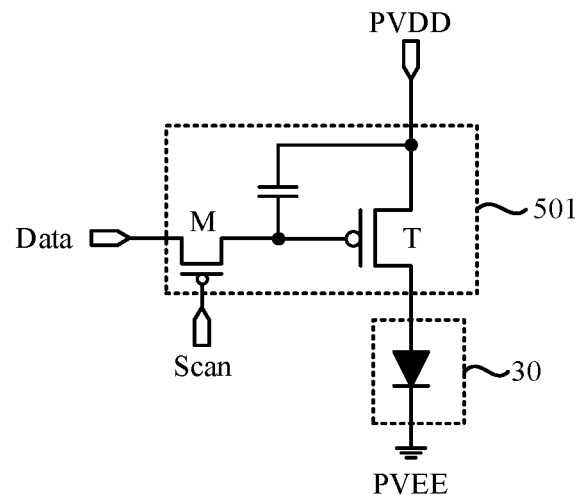
FIG. 16 is a schematic diagram of a circuit structure of a driver circuit according to an embodiment of the present disclosure.

In an exemplary embodiment, as shown in FIG. 16, the driver circuit 501 may be a conventional 2T1C circuit (including two transistors M and T and one storage capacitor Cst). A switching transistor M is turned on or off under the control of a scanning signal Scan, and in the case where the switching transistor M is turned on, the switching transistor M can transmit a data signal Data to a gate of a drive transistor T so that the drive transistor T provides a corresponding display light emission signal to the light-emitting element 30 according to a signal of the gate, where the display light emission signal is transmitted to the light-emitting element 30 through a path formed by power supplies PVDD and PVEE, so as to control the light-emitting elements 30 to emit light.

Figure 17:
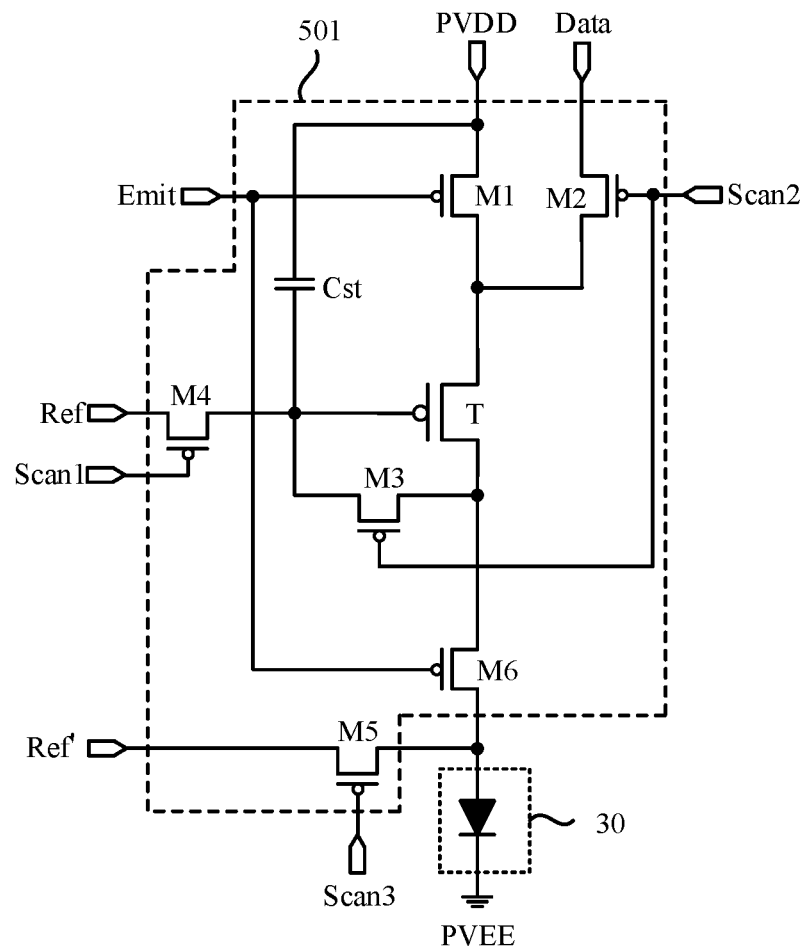
FIG. 17 is a schematic diagram of a circuit structure of another driver circuit according to an embodiment of the present disclosure.

In another exemplary embodiment, as shown in FIG. 17, the driver circuit 501 may also be a common 7T1C circuit (including seven transistors M1, M2, M3, M4, M5, M6 and T, and one storage capacitor Cst). Among the seven transistors, the transistors M1, M2, M3, M4, M5 and M6 are used as switching transistors and are turned on or off under the control of corresponding scanning signals (Scan1, Scan2, Scan3 and Emit), so as to control a data signal Data, an initialization signal Ref, and a reset signal Ref, thereby providing on and off of a corresponding transmission path. The transistor T is used as a drive transistor and configured to convert the data signal Data into the display light emission signal capable of driving the light-emitting element 30 to emit light. The reset signal Ref may be the same as or different from the initialization signal Ref, which is not specifically limited in the embodiments of the present disclosure. It is to be understood that, in the case where the driver circuit provided in the embodiments of the present disclosure is the 7T1C circuit, drive timing of the 7T1C circuit may be similar to drive timing of the 7T1C circuit well known to those skilled in the art, which is not repeated here.

With continued reference to FIG. 15, the driver circuit layer 50 may include at least one metal layer (51, 52, or 53), and the at least one metal layer (51, 52, or 53) includes at least part of the driver circuit 501. For example, the at least one metal layer may include at least one of a gate of a transistor, a source/drain electrode, an electrode plate of a storage capacitor, a transmission signal line or a connection signal line in the driver circuit. In addition, the light-emitting panel may further include a second reflective layer 40 located between the base substrate 10 and the light-emitting elements 30, where the second reflective layer 40 includes at least part of the second reflective portion 41. Reflectivity of the second reflective layer may be greater than reflectivity of the at least one metal layer (51, 52, or 53) in the driver circuit layer 50.

In an embodiment, the second reflective layer 40 including at least part of the second reflective portion 41 should have a strong light reflective capability so that the light reaching the second reflective portion 41 can be reflected efficiently; the metal layer (51, 52, or 53) of the driver circuit layer 50 includes at least part of the driver circuit 501 so that the metal layer (51, 52, or 53) needs to have good electrical conductivity so as to satisfy requirements for a signal to transmit in a corresponding structure of the metal layer (51, 52, or 53), and the metal layer does not need to have relatively high reflective capability. Therefore, the reflectivity of the formed second reflective layer 40 may be greater than the reflectivity of the metal layer (51, 52, or 53) in the driver circuit layer 50. In an optional embodiment, the material of the second reflective layer 40 may be the same as the material of some of the metal layers (51, 52, and 53) in the driver circuit layer. In this case, an upper surface of the second reflective layer 40 facing away from the base substrate 10 is processed, so as to achieve relatively high reflectivity. In an embodiment, the second reflective layer 40 may be made of a material with relatively high reflectivity, such as silver or aluminum; and the metal layer (51, 52, or 53) of the driver circuit 501 may be made of a material with good electrical conductivity, such as Ti—Al—Ti alloy material. On the premise that the second reflective layer 40 has relatively large reflectivity and the metal layer (51, 52, or 53) in the driver circuit layer 50 has relatively strong electrical conductivity, materials of the second reflective layer 40 and the metal layer (51, 52, or 53) in the driver circuit layer 50 is not specifically limited in the embodiments of the present disclosure.

In an embodiment, with continued reference to FIG. 15, in the case where the driver circuit 501 includes at least one transistor TM, the driver circuit layer 50 includes the metal layers (51, 52, and 53) and further includes a semiconductor layer 54, where the semiconductor layer 54 includes an active layer 541 of the transistor TM. In this case, if the second reflective layer 40 is located between the semiconductor layer 54 and the base substrate 10, that is, the second reflective layer 40 is located on a side of the semiconductor layer 54 facing toward the base substrate 10, then the second reflective portion 41 and the active layer 541 do not overlap each other in the direction Z perpendicular to the plane where the base substrate 10 is located.

In an embodiment, when exposed to light, a channel of the active layer 541 of the transistor TM forms photo-generated carriers, that is, electron-hole pairs, electrons move toward a drain of the transistor TM, and holes move toward a source of the transistor TM, thereby forming a leakage current, affecting the performance of the transistor TM, so that the transistor TM cannot accurately transmit a corresponding signal, thereby affecting the display luminance of the light-emitting element 30. At the same time, in the case where the second reflective layer 40 is located between the semiconductor layer 54 and the base substrate 10, the second reflective portion 41 in the second reflective layer 40 reflects the light that leaks out from the gap 201, and the light reflected by the second reflective portion 41 needs to pass through a film layer where the active layer 541 of the transistor M is located. In this manner, the second reflective portion 41 and the active layer 541 do not overlap each other in the direction Z perpendicular to the plane where the base substrate 10 is located so that the problem that the light reflected by the second reflective portion 41 reaches the channel of the transistor TM so that the leakage current of the transistor TM increases and the performance of the transistor TM is affected can be ameliorated or avoided. In this manner, the accuracy of the signal transmitted by the transistor TM in the driver circuit 501 is improved so that display light emission accuracy of the light-emitting elements 30 can be improved, thereby improving the display light emission effect of the light-emitting panel 100.

In an embodiment, with continued reference to FIG. 15, in the case where the light-emitting element 30 is a mini-LED or micro-LED, the light-emitting panel 100 should also include a connection electrode 61 bonded with an electrode of the light-emitting element 30, where the connection electrode 61 may be located between the light-emitting element 30 and a first metal layer 51 so that the light-emitting element 30 is electrically connected to a signal line 600 through the connection electrode 61. The connection electrode 61 and the signal line 600 are located in a same metal layer 60.

In addition, with continued reference to FIG. 15, the light-emitting panel 100 should further include insulating layers (14 and 15) located between any two adjacent metal layers (51, 52, and 53), an insulating layer located between the semiconductor layer 54 and a corresponding metal layer (52), insulating layers 11 and 12 located between the first reflective layer 40 and a corresponding film layer in the driver circuit layer 50, and an insulating layer 16 covering each device structure of the driver circuit 501. The insulating layer 16 may be a structure that can fill the concave and convex generated by the patterning of each device structure in the driver circuit 501, or the insulating layer 61 may also be a film layer similar to other insulating layers located between any two metal layers, such as a silicon oxide insulating layer and a silicon nitride insulating layer, which is not specifically limited in the embodiments of the present disclosure. At the same time, a corresponding insulating layer may be provided on a side of the metal layer 60 facing away from the base substrate 10 so as to protect the metal layer 60, or the insulating layer on the side of the metal layer 60 facing away from the base substrate 10 may not be provided and may be directly replaced by the first reflective layer 20, so as to achieve the object of simplifying the film layers and saving the process.

It is to be noted that FIG. 15 is only an exemplary drawing of a light-emitting panel according to an embodiment of the present disclosure. In FIG. 15, the connection electrode 61 needs to be connected to the signal line 600 provided on a same layer and then the signal line 600 passes through a corresponding via hole and is electrically connected to the driver circuit 501. In the embodiments of the present disclosure, the arrangement of the film layers of the light-emitting panel is not limited to this. It is to be understood that FIG. 15 shows a structural diagram of a film layer. Due to a position of a cross section of the film layer, the connection electrode 61 and the signal line 600 shown in FIG. 15 are disconnected. However, in the embodiment of the present disclosure, the connection electrode 61 and the signal line 600 are electrically connected to each other.

Figure 18:
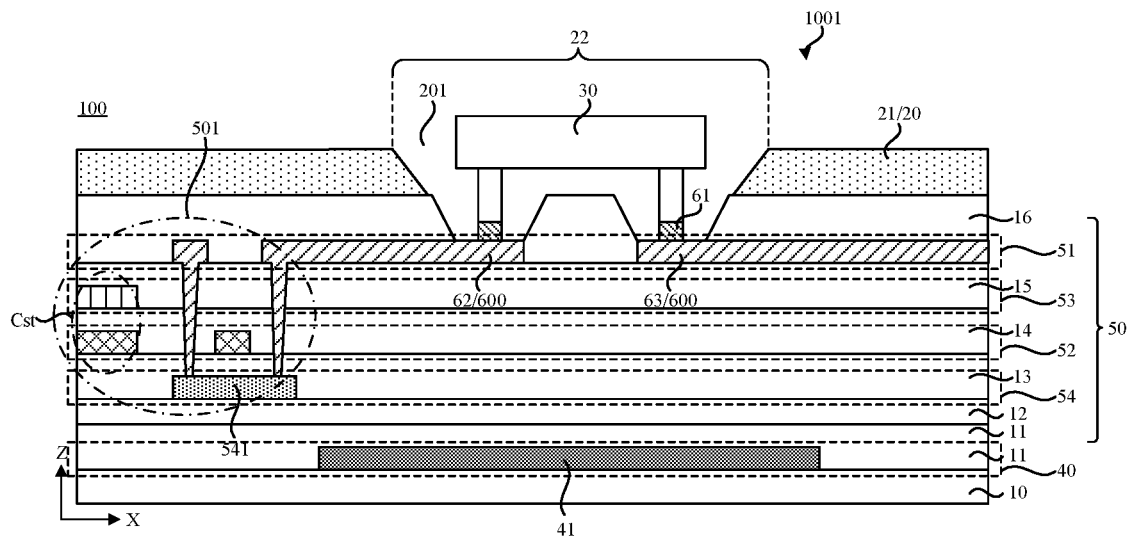
FIG. 18 is a structural diagram of a film layer of another light-emitting panel according to an embodiment of the present disclosure.

In an embodiment, FIG. 18 is a structural diagram of a film layer of another light-emitting panel according to an embodiment of the present disclosure. For the same parts in FIGS. 18 and 15, reference may be made to the preceding description of FIG. 15, which is not repeated herein. Only differences between FIGS. 18 and 15 are exemplified. As shown in FIG. 18, a corresponding connection signal line 62 is formed in a metal layer 51 of the driver circuit layer 50 so that the connection electrode 61 is electrically connected to the driver circuit 501 through the connection signal line 62. In this case, an opening structure may be formed in the insulating layer 16 so that part of the connection signal line 62 is exposed, and the connection electrode 61 may be in direct contact with the connection signal line 62. In this manner, after the electrode of the light-emitting element 30 is bonded with the connection electrode 61, the light-emitting element 30 is electrically connected to the driver circuit 501.

For ease of description, unless otherwise specified, in the embodiments of the present disclosure, the structural diagram of the film layer of the light-emitting panel shown in FIG. 18 is used as an example for the exemplary description of the technical solutions in the embodiments of the present disclosure.

It is to be understood that the driver circuit layer may include one or more metal layers, which may be designed according to actual requirements, which is not be specifically limited in the embodiments of the present disclosure. For ease of description, in the embodiments of the present disclosure, the case where the driver circuit layer includes multiple metal layers is used as an example for the exemplary description of the technical solutions in the embodiments of the present disclosure.

In an embodiment, with continued reference to FIG. 18, at least one metal layer (51, 52, or 53) may include a first metal layer; in this case, the second reflective layer 40 may be located between the first metal layer (51, 52, or 53) and the base substrate 10.

In an embodiment, the first metal layer may be the metal layer 51 including at least one of a source/drain electrode of a transistor, a data signal line, a power supply signal line, or a connection signal line, where the data signal line is used for transmitting a data signal Data, the power supply signal line is used for transmitting a power supply signal PVDD and/or PVEE, and the connection signal line is used for connecting a transistor, a storage capacitor and the like in the driver circuit. In an embodiment, the first metal layer may be a metal layer 52 including at least one of a gate of a transistor or a scanning signal line, where the scanning signal line is used for transmitting a scanning signal Scan (Scan1, Scan2, or Scan3). In an embodiment, the first metal layer may also be a metal layer 53 including at least one of an electrode plate of the storage capacitor Cst, a reset signal line, or an initialization signal line, where the reset signal line is used for transmitting a reset signal Ref, and the initialization signal line is used for transmitting an initialization signal Ref. The specific structure provided in the first metal layer is not specifically limited in the embodiments of the present disclosure.

In an optional embodiment, the first metal layer may include a signal line, where the signal line is electrically connected to the light-emitting element 30; and in the direction Z perpendicular to the plane where the base substrate 10 is located, the signal line overlaps the second reflective portion 41 located in the second reflective layer 40.

Figure 19:
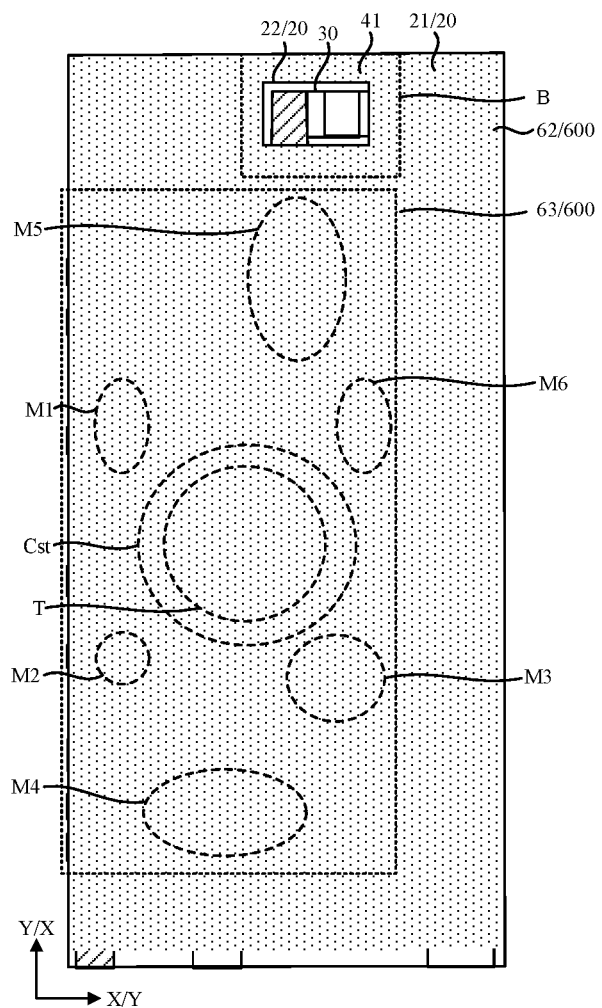
FIG. 19 is a partial top diagram of a film layer of a light-emitting panel corresponding to FIG. 17.

In an embodiment, the case where the driver circuit 501 is a 7T1C circuit is used as an example. FIG. 19 is a partial top diagram of a film layer of a light-emitting panel corresponding to FIG. 17. Referring to FIGS. 17, 18 and 19, in the case where the first metal layer is the metal layer 51 including the source/drain electrode of the transistor, two electrodes (an anode and a cathode) of the light-emitting element 30 need to receive different signals, respectively, so as to drive the light-emitting element 30 to emit light, so that the anode of the light-emitting element 30 needs to be electrically connected to the driver circuit 501 through the corresponding signal line 600 (the connection signal line 62), and the cathode of the light-emitting element 30 also needs to receive the corresponding power supply signal PVEE through the corresponding signal line 600 (the power supply signal line 63). In this case, the signal line 600 needs to cross a region of an orthographic projection of the gap 201 on the first metal layer 51 so that in the direction perpendicular to the plane where the base substrate 10 is located, the signal line 600 and the second reflective portion 41 located in the second reflective layer 40 have a certain overlap.

Figure 20:
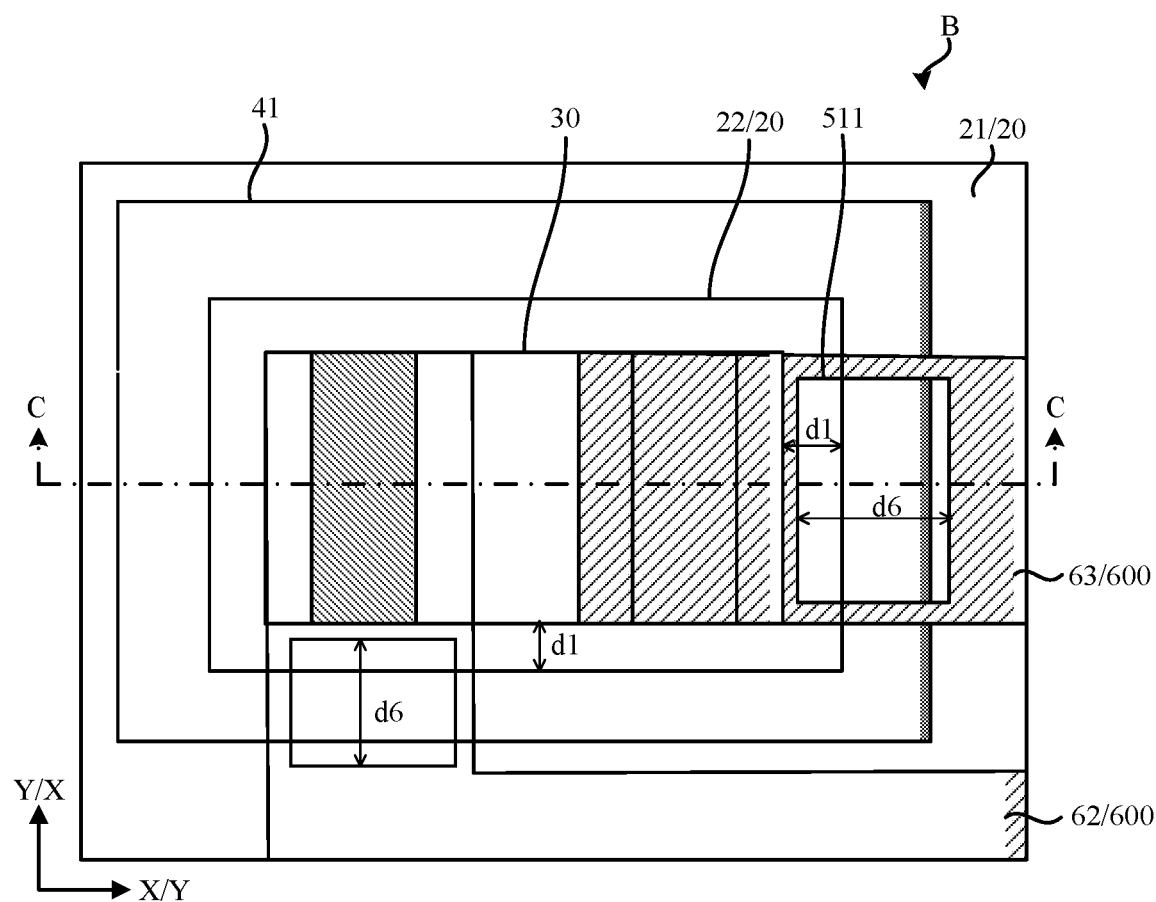
FIG. 20 is an enlarged top diagram of a film layer of region B of FIG. 19.
Figure 21:
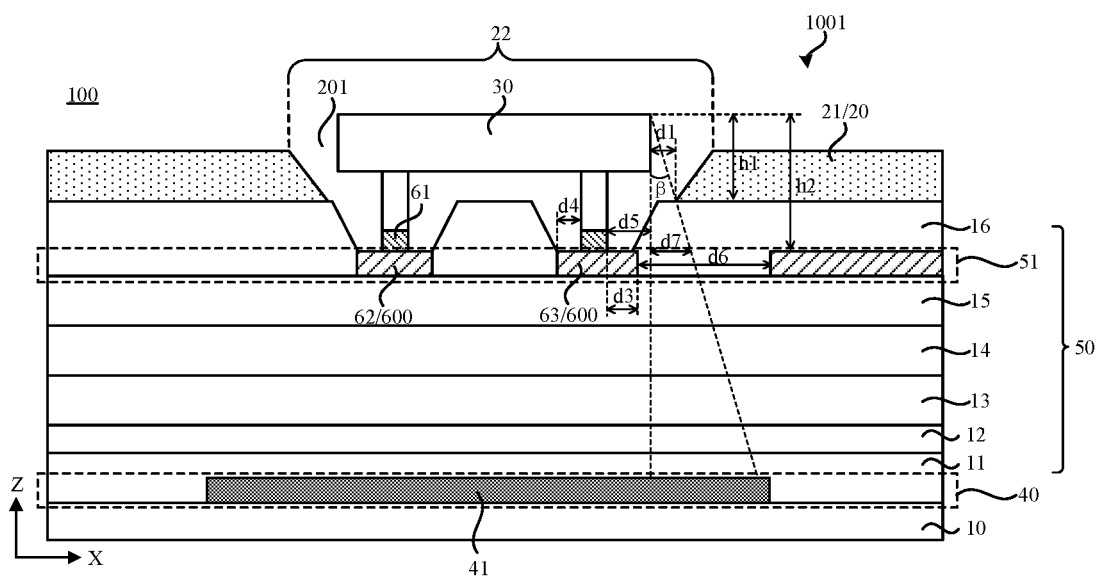
FIG. 21 is a sectional diagram taken along section C-C of FIG. 20.

In an embodiment, FIG. 20 is an enlarged top diagram of a film layer of region B of FIG. 19, and FIG. 21 is a sectional diagram taken along section C-C of FIG. 20. Referring to FIGS. 19, 20 and 21, the signal line 600 (62 and 63) includes at least one light-transmitting hole 511, where in the direction Z perpendicular to the plane where the base substrate 10 is located, the light-transmitting hole 511 overlaps the second reflective portion 41 in the second reflective layer 40.

In an embodiment, the second reflective layer 40 with relatively high reflectivity is located between the first metal layer 51 and the base substrate 10 and the reflectivity and light transmittance of the first metal layer 51 are both relatively small so that part of the signal line 600 in the first metal layer 51 blocks part of the light from propagating toward the side of the base substrate 10 and blocks part of the light reflected by the second reflective portion 41 in the second reflective layer 40. At the same time, the first metal layer 51 cannot reflect the light efficiently, thereby affecting the light utilization rate. In this case, the corresponding light-transmitting hole 511 is disposed in the signal line 600 that is in the first metal layer 51 and overlaps the second reflective portion 41 in the second reflective layer 40 so that the light propagating toward the side of the base substrate 10 reaches the second reflective portion 41 in the second reflective layer 40 through the light-transmitting hole 511 and is efficiently reflected by the second reflective portion 41, and the light reflected by the second reflective portion 41 can also reach the display light-emitting surface 1001 through the light-transmitting hole 511, thereby improving the light utilization rate, which is conducive to improving the display luminance of the light-emitting panel 100 and reducing the power consumption of the light-emitting panel 100.

Figure 22:
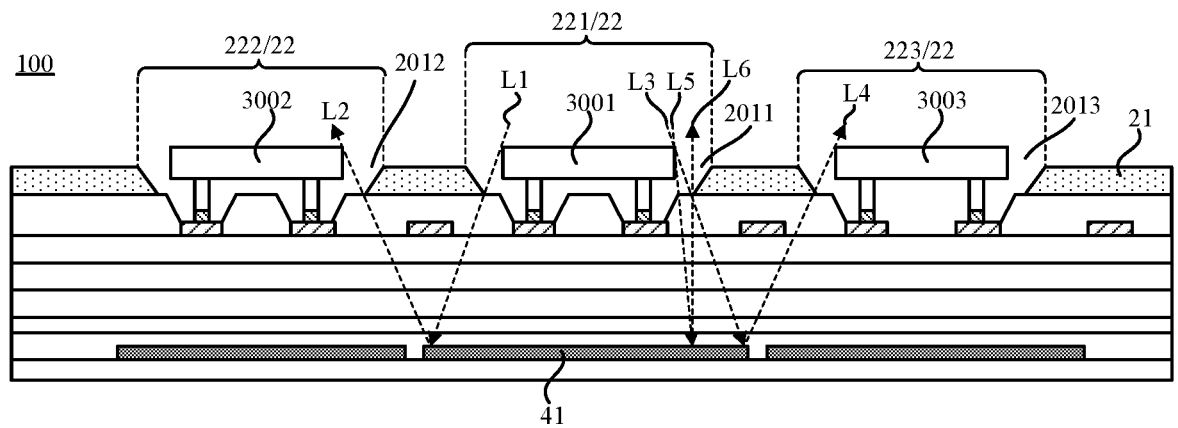
FIG. 22 is a structural diagram of a film layer of another light-emitting panel according to an embodiment of the present disclosure.

In an embodiment, as shown in FIG. 22, a gap 2011 exists between a light-emitting element 3001 located in an opening structure 221 and the first reflective portion 21, a gap 2012 exists between a light-emitting element 3002 located in an opening structure 222 and the first reflective portion 21, and a gap 2013 exists between a light-emitting element 3003 located in an opening structure 223 and the first reflective portion 21. A reflection situation of the second reflective portion 41 corresponding to the light-emitting element 3001 located in the opening structure 221 is used as an example. In the case where the light-transmitting hole and the second reflective portion satisfy the preceding condition, after light L1 entering the gap from a left extreme position of the light-emitting element 3001 reaches the second reflective portion 41 through the gap 2011 and the corresponding light-transmitting hole, reflective light L2 reflected by the second reflective portion 41 can reach the display light-emitting surface of the light-emitting panel 100 from the gap 2012; after light L3 entering the gap from a right extreme position of the light-emitting element 3001 reaches the second reflective portion 41 through the gap 2011 and the corresponding light-transmitting hole, reflective light L4 reflected by the second reflective portion 41 can reach the display light-emitting surface of the light-emitting panel 100 from the gap 2013; in addition, after light L5 reaches the second reflective portion 41 through the gap 2011 and the corresponding light-transmitting hole, the reflective light L4 reflected by the second reflective portion 41 can reach the display light-emitting surface of the light-emitting panel 100 again from the gap 2011. In this manner, light transmits such that the light-transmitting hole and the second reflective portion satisfy the preceding condition, thereby significantly improving the light utilization rate.

It is to be understood that without considering transmission impedance of the signal line 600 and the like, in the direction perpendicular to the plane where the base substrate 10 is located, the larger an overlapping area of the light-transmitting hole 511 and the second reflective portion 41 is, the more beneficial it is to the improvement of the light utilization rate; or the larger a dimension of the light-transmitting hole in a direction X parallel to the plane where the base substrate 10 is located, the more beneficial it is to the improvement of the light utilization rate. However, in general, the dimension of the light-transmitting hole 511 does not increase indefinitely. The direction X here may be an extension direction of a long side of the signal line 600 overlapping with the second reflective portion 41, may be a row direction of the light-emitting elements 30 arranged in an array, or may be a column direction of the light-emitting elements 30 arranged in an array, which is not specifically limited in the embodiments of the present disclosure.

In an optional embodiment, referring to FIGS. 20 and 21, in the direction perpendicular to the plane where the base substrate 10 is located, the connection electrode 61 overlaps the signal line 600; along the first direction X, a shortest distance between the connection electrode 61 and the light-transmitting hole 511 is d3, and a shortest distance between the connection electrode 61 and an edge of the signal line 600 (for example, the power supply signal line 63) is d4, where d3≥d4; and the first direction X is parallel to the plane where the base substrate 10 is located. In this manner, on the premise of ensuring that the light-transmitting hole 511 has a sufficiently large dimension in the first direction X, it can also be ensured that the connection electrode 61 and the signal line 63 have a sufficient contact area. In this manner, the following phenomenon is avoided: the connection electrode 61 is virtually connected to the signal line 63, the corresponding signal cannot be accurately transmitted to the connection electrode 61, and the light-emitting element 30 emits light abnormally.

In an embodiment, with continued reference to FIGS. 20 and 21, a distance between a surface of a side of the light-emitting element 30 facing away from the base substrate 10 and a surface of a side of the first reflective layer 20 facing toward the base substrate 10 is h1; a distance between the surface of the side of the light-emitting element 30 facing away from the base substrate 10 and a surface of a side of the first metal layer 51 facing away from the base substrate 10 is h2; among the connection electrode 61 and the light-emitting element 30 electrically connected to each other, a distance along the first direction X between a side of the connection electrode 61 closer to the first reflective portion 21 and a side of the light-emitting element 30 closer to the first reflective portion 21 is d5; a minimum width of the gap 201 between the light-emitting element 30 and the first reflective layer 20 along the first direction X is d1; and along the first direction, a value range of a length d6 of the light-transmitting hole 511 satisfies that d6≥d5−d3+(d1/h1)*h2.

In an embodiment, in a section of section C-C, based on the triangle similarity principle, it can be known that tanβ=d1/h1=d7/h2, that is, d7=(d1/h1)*h2, where d7 denotes a minimum dimension extending from a side of the light-emitting element 30 along the first direction X toward a side facing away from the light-emitting element 30 to an edge of the light-transmitting hole 511. In addition, the dimension of the light-transmitting hole 511 in the first direction X should further include a direction extending from a side of the light-emitting element 30 along the first direction X toward a side of the connection electrode 61, that is, d5-d3. In this manner, a minimum dimension of the light-transmitting hole 511 in the first direction X should be d5−d3+(d1/h1)*h2. Only in the case where the dimension d6 of the light-transmitting hole 511 in the first direction X is greater than or equal to d5−d3+(d1/h1)*h2, enough light can pass through the light-transmitting hole 511 to reach the second reflective portion 41 located on a side of the first metal layer 51 facing toward the base substrate 10, thereby effectively improving the light utilization rate.

Figure 23:
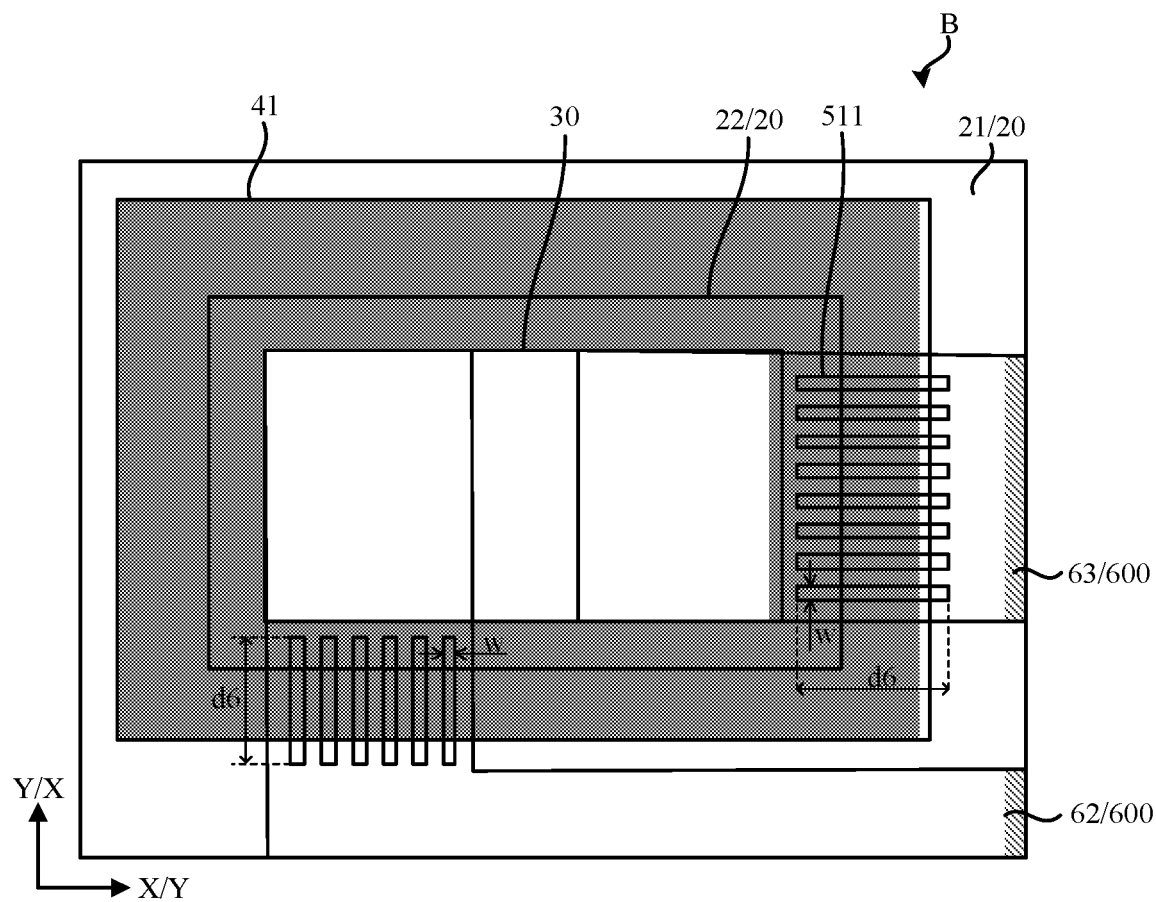
FIG. 23 is another enlarged top diagram of a film layer of region B of FIG. 19.

It is to be noted that the above only uses the case where one light-transmitting hole 511 is disposed on the signal line 600 as an example for the exemplary description of the technical solutions in the embodiments of the present disclosure. In an optional embodiment of the present disclosure, as shown in FIG. 23, multiple light-transmitting holes 511 may be disposed on the signal line 600, where the multiple light-transmitting holes 511 are arranged at intervals along a second direction Y, where the second direction Y is parallel to the base substrate 100. In this case, the signal line 600 reserved between two adjacent light-transmitting holes may be used for signal transmission so that the signal line 600 has relatively small impedance, and the loss of the signal transmitted by the signal line 600 is reduced, that is, the accuracy and uniformity of the signal transmitted by the signal line 600 are improved. In this manner, on the premise of satisfying requirements for light transmission and improving the light utilization rate, the display light emission effect of the light-emitting panel can be improved. The second direction Y may intersect with the first direction X or may be parallel to the first direction X, which is not specifically limited in the embodiments of the present disclosure.

In an optional embodiment, with continued reference to FIG. 23, a width w of the light-transmitting hole 511 in the second direction Y is greater than or equal to 1 μm. When satisfying the process preparation condition, the light-transmitting hole 511 can have a relatively large width, so as to satisfy the requirements for light transmission.

In the case where the second direction Y intersects with the first direction X, the first direction X may be a length direction of the light-transmitting hole 511, and the second direction Y is a width direction of the light-transmitting hole 511. The second direction Y and the first direction X are determined according to an overlapping condition of the signal line 600 and the second reflective portion 41 and do not refer to determined directions.

It is to be understood that the above only uses the case where an orthographic projection of the light-transmitting hole 511 on the base substrate 10 is a rectangle as an example for the exemplary description of the technical solutions in the embodiments of the present disclosure, and in the embodiments of the present disclosure, a shape of the orthographic projection of the light-transmitting hole 511 on the base substrate 10 may also be a circle an ellipse, a triangle, or other regular or irregular shapes, which is not specifically limited in the embodiments of the present disclosure.

It is to be noted that the above uses the case where the first metal layer includes only the structure of the driver circuit as an example for the exemplary description of the technical solutions in the embodiments of the present disclosure. In the embodiments of the present disclosure, the first metal layer may also include part of the second reflective portion.

Figure 24:
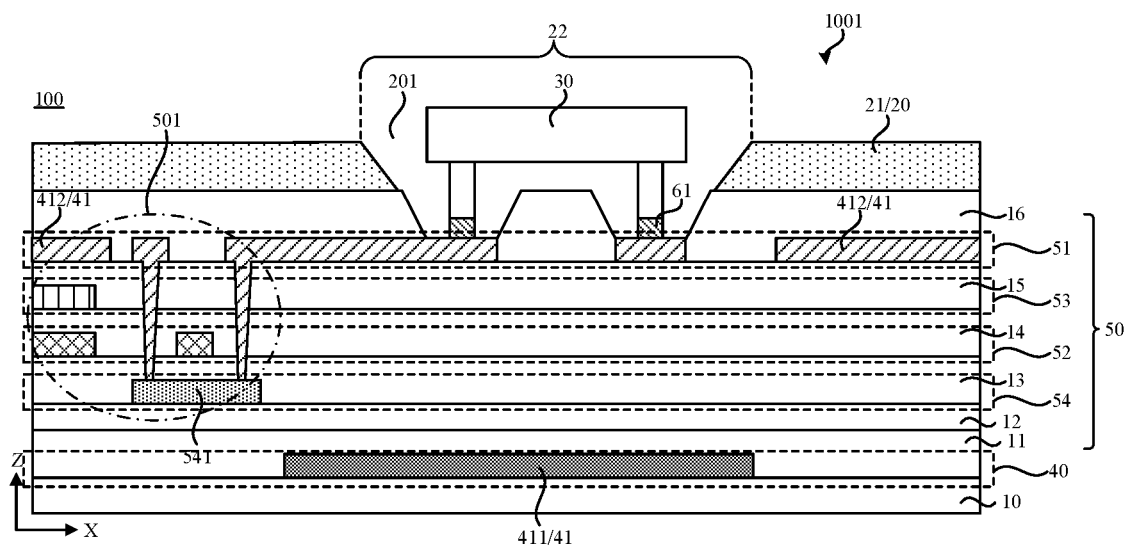
FIG. 24 is a structural diagram of a film layer of another light-emitting panel according to an embodiment of the present disclosure.

In an embodiment, FIG. 24 is a structural diagram of a film layer of another light-emitting panel according to an embodiment of the present disclosure. As shown in FIG. 24, the first metal layer 51 may include part of a second reflective portion 412. In this case, in the direction perpendicular to the plane where the base substrate 10 is located, the second reflective portion 412 located in the first metal layer 51 and a second reflective portion 411 located in the second reflective layer 40 do not overlap each other.

In an embodiment, reflectivity of the second reflective layer 40 is greater than reflectivity of the first metal layer 51. Therefore, in the case where in the direction perpendicular to the plane where the base substrate 10 is located, the second reflective portion 412 located in the first metal layer 51 and the second reflective portion 411 located in the second reflective layer 40 do not overlap each other, most of the light that leaks out from the gap 201 can reach the second reflective portion 411 in the second reflective layer 40 so that the second reflective portion 411 in the second reflective layer 40 fully reflects the light, and the second reflective portion 412 in the first metal layer 51 can reflect other light that cannot reach the second reflective portion 411, so as to achieve a relatively high light utilization rate and satisfy display light emission requirements of the light-emitting panel 100 with high display requirements.

It is to be noted that the above uses the case where the second reflective layer 40 is located between the base substrate and the driver circuit layer 50 as an example for the exemplary description of the technical solutions in the embodiments of the present disclosure, and in the embodiments of the present disclosure, in the case where the driver circuit layer 50 includes multiple film layers, the second reflective layer 40 may also be located between any two adjacent film layers in the driver circuit layer 50.

Figure 25:
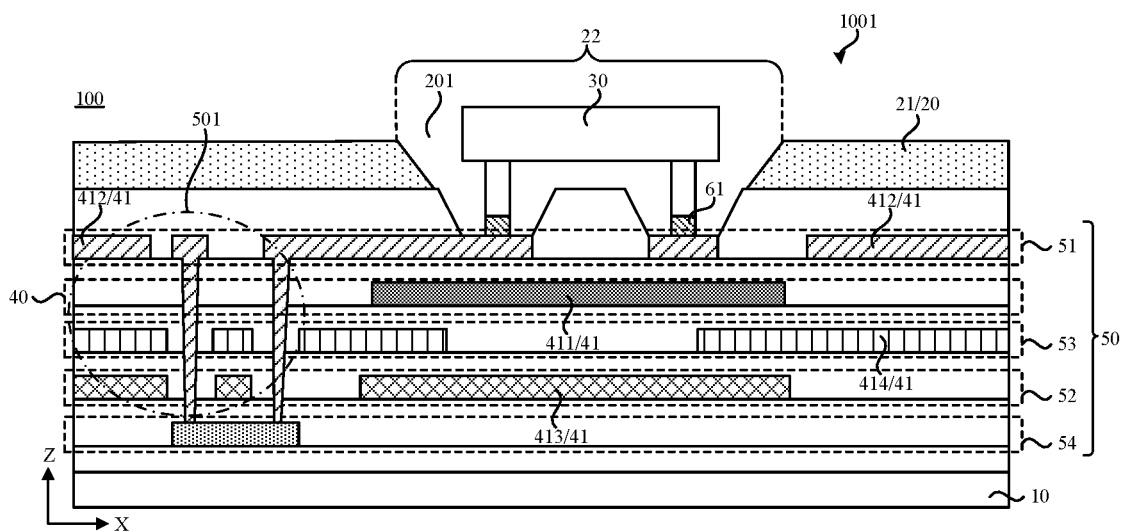
FIG. 25 is a structural diagram of a film layer of another light-emitting panel according to an embodiment of the present disclosure.

In an embodiment, FIG. 25 is a structural diagram of a film layer of another light-emitting panel according to an embodiment of the present disclosure. As shown in FIG. 25, at least one metal layer may further include a second metal layer 52 (or 53) that is mutually insulated from the first metal layer 51. In this case, the second reflective layer 40 may be located between the first metal layer 51 and the second metal layer 52 (or 53). Correspondingly, the second metal layer 52 (or 53) may also include part of a second reflective portion 413 (or 414), and in the direction Z perpendicular to the plane where the base substrate 10 is located, the second reflective portion 413 (or 414) at least partially located in the second metal layer 52 (or 53) overlaps the second reflective portion 411 located in the second reflective layer 40, and the second reflective portion 412 located in the first metal layer 51 overlaps the second reflective portion 413 (or 414) located in the second metal layer 52 (or 53).

In an embodiment, the second reflective layer 40 with relatively high reflectivity is located on a side of the second metal layer 52 (or 53) facing away from the base substrate. Therefore, the second reflective portion 413 (or 414) in the second metal layer 52 (or 53) does not block the second reflective portion 411 in the second reflective layer 40. In this case, in the direction Z perpendicular to the plane where the base substrate 10 is located, the second reflective portion 413 (or 414) at least partially located in the second metal layer 52 (or 53) overlaps the second reflective portion 411 in the second reflective layer 40 so that the second reflective portion 413 (or 414) in the second metal layer 52 (or 53) reflects part of the light passing through the second reflective layer 40, thereby achieving a relatively high light utilization rate. At the same time, in the direction Z perpendicular to the plane where the base substrate 10 is located, the second reflective portion 413 (or 414) in the second metal layer 52 (or 53) can also overlap the second reflective portion 412 located in the first metal layer 51 so that light at a gap in the first direction X between the second reflective portion 411 located in the second reflective layer 40 and the second reflective portion 412 located in the first metal layer 51 is reflected, thereby further improving the light utilization rate.

Figure 26:
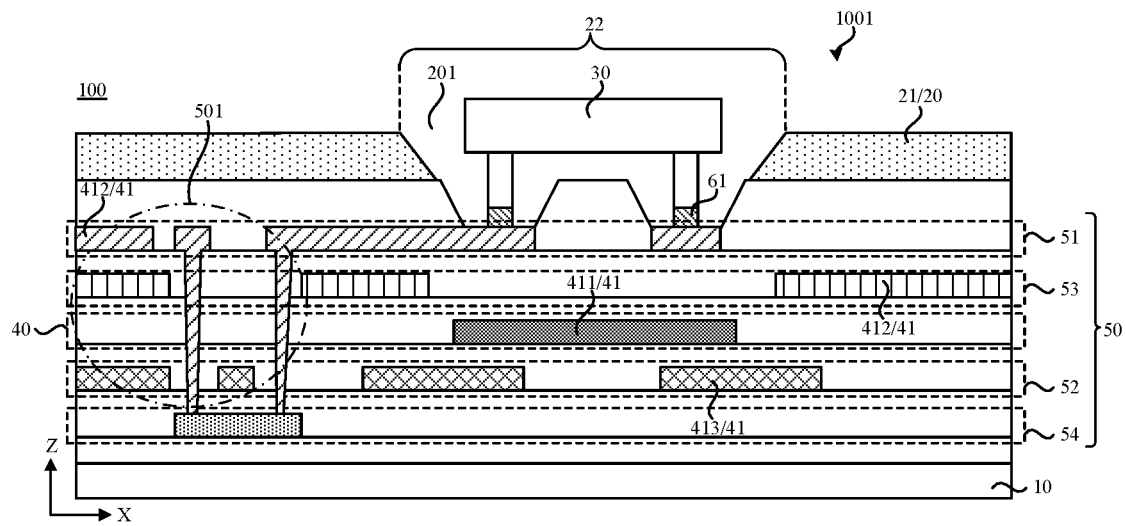
FIG. 26 is a structural diagram of a film layer of another light-emitting panel according to an embodiment of the present disclosure.

It is to be noted that the above only uses the case where the first metal layer is the metal layer 51 farthest from the base substrate 10 in the driver circuit layer 50 as an example. In another embodiment of the present disclosure, as shown in FIG. 26, the first metal layer may also be a metal layer 53 in the middle of the driver circuit layer 50, and in this case, the second metal layer is the metal layer 52 located on a side of the first metal layer 53 facing toward the base substrate 10. The principle here is similar to that the first metal layer is the metal layer 51 farthest from the base substrate 10 in the driver circuit layer 50, and reference may be made to the preceding description in which the first metal layer is the metal layer 51 farthest from the base substrate 10 in the driver circuit layer 50 for the same part, which is not repeated herein.

Figure 27:
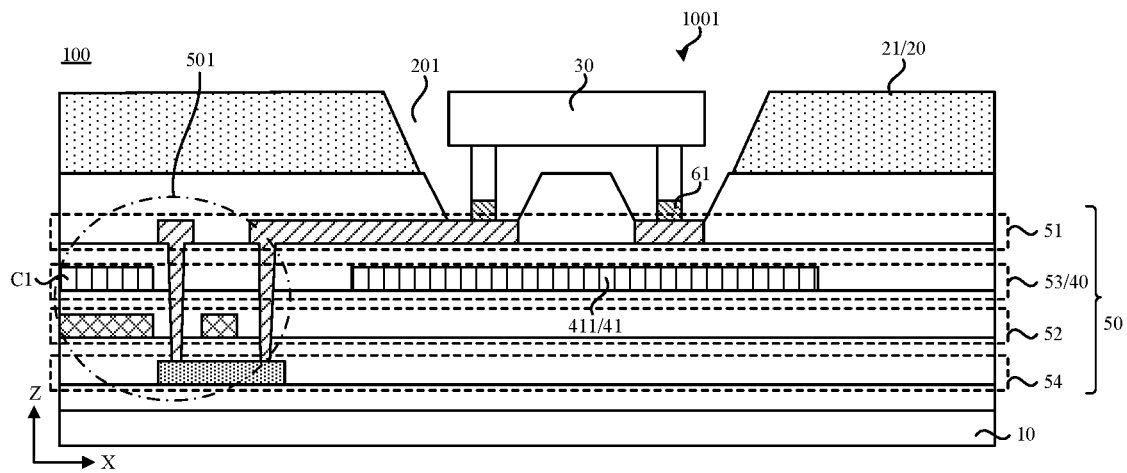
FIG. 27 is a structural diagram of a film layer of another light-emitting panel according to an embodiment of the present disclosure.

In an embodiment, as shown in FIG. 27, in the case where the second reflective layer 40 is a metal reflective layer, the driver circuit layer 50 may include the second reflective layer 40; in this case, the second reflective layer 40 and the metal layer (51 or 52) are insulated from each other, and the second reflective layer 40 may further include part of the structure of the driver circuit 501. For example, on the premise that the second reflective layer 40 includes at least part of the second reflective portion 41, the second reflective layer 40 may further include an electrode plate C1 of a storage capacitor. In this manner, the material of the second reflective layer 40 is reasonably selected so that the second reflective layer 40 has both electrical conductivity and reflectivity and thus the second reflective layer 40 can be reused as the metal layer 53 in the driver circuit 501, so to simplify a film layer structure and a preparation process of the light-emitting panel 100, thereby reducing the manufacturing costs of the light-emitting panel 100 and improving the production efficiency of the light-emitting panel 100, which is conducive to miniaturization of the light-emitting panel 100.

Figure 28:
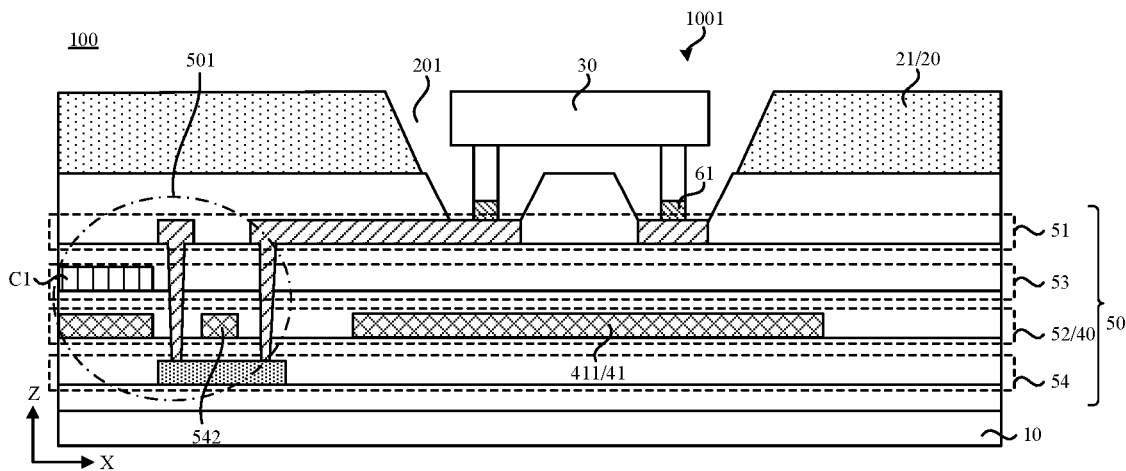
FIG. 28 is a structural diagram of a film layer of another light-emitting panel according to an embodiment of the present disclosure.
Figure 29:
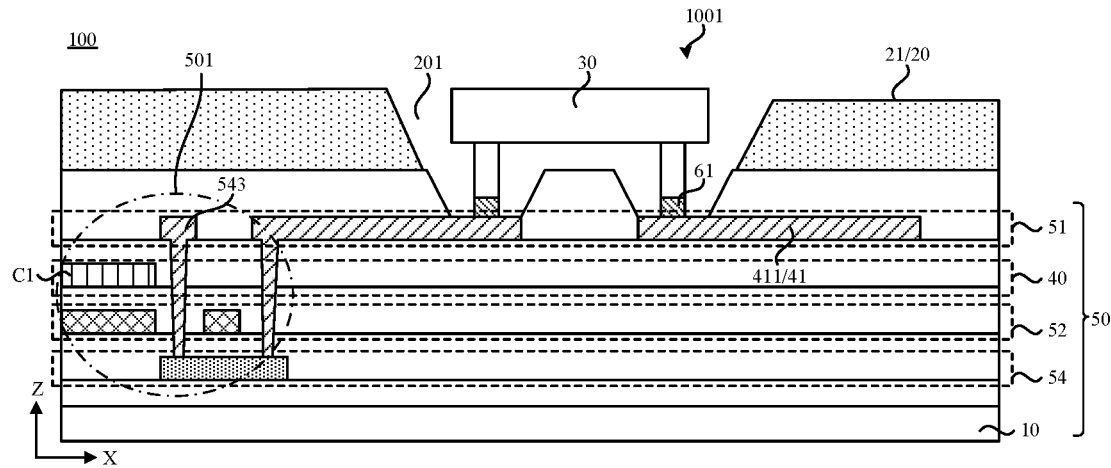
FIG. 29 is a structural diagram of a film layer of another light-emitting panel according to an embodiment of the present disclosure.

It is to be noted that, by way of example, FIG. 27 only shows that the second reflective layer 40 is reused as the metal layer 53 including an electrode plate of a storage capacitor disposed in the driver circuit 501, and in the embodiments of the present disclosure, in the case where the second reflective layer 40 further includes part of the structure of the driver circuit 501, the second reflective layer 40 may also be reused as a film layer including other structures in the driver circuit 501. By way of example, as shown in FIG. 28, the second reflective layer 40 may also be reused as the metal layer 52 including a gate 542 of a transistor in the driver circuit 501; or as shown in FIG. 29, the second reflective layer 40 may also be reused as the metal layer 51 including a source/drain electrode 542 of a transistor in the driver circuit 501. The embodiments of the present disclosure are not specifically limited to this.

Figure 30:
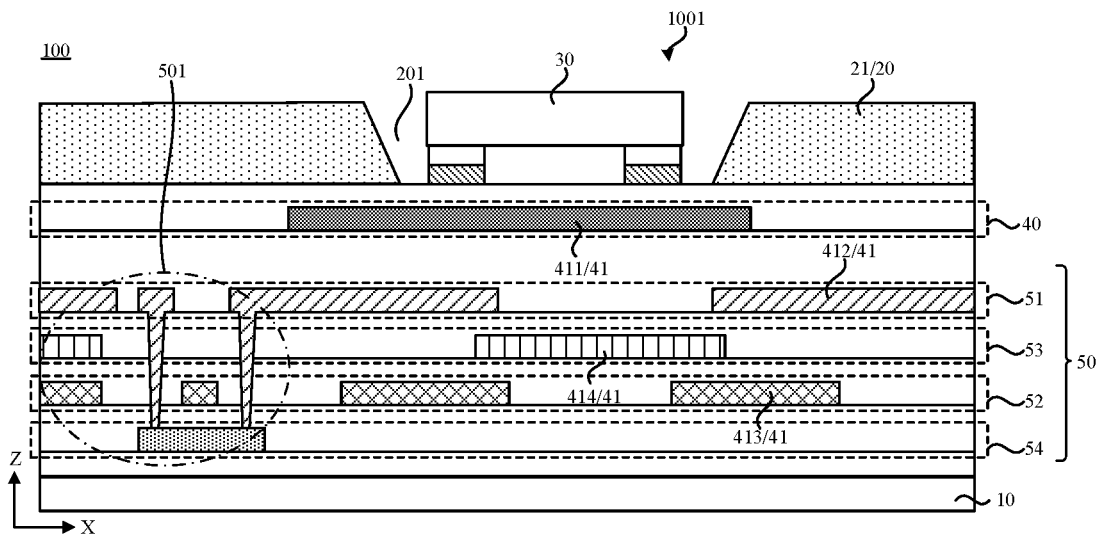
FIG. 30 is a structural diagram of a film layer of another light-emitting panel according to an embodiment of the present disclosure.

In an optional embodiment of the present disclosure, as shown in FIG. 30, the second reflective layer 40 may also be located between the driver circuit layer 50 and the light-emitting element 30. In this case, the second reflective portion 411 in the second reflective layer 40 is not blocked by the film layer in the driver circuit layer 50 so that the light that leaks out from the gap and reaches the second reflective layer 40 can be efficiently reflected.

In an embodiment, with continued reference to FIG. 30, in the case where the second reflective layer 40 may also be located between the driver circuit layer 50 and the light-emitting element 30, the metal layer 51 (52 or 53) of the driver circuit 50 may further include part of the second reflective portion 412 (413 or 414), and in the direction Z perpendicular to the plane where the base substrate 10 is located, the second reflective portion 412 (413 or 414) located in the metal layer 51 (52 or 53) overlaps the second reflective portion 411 located in the second reflective layer 40. In this manner, the second reflective portion 412 (413 or 414) located in the metal layer 51 (52 or 53) can reflect the light passing through the second reflective layer 40, thereby further improving the light utilization rate.

Figure 31:
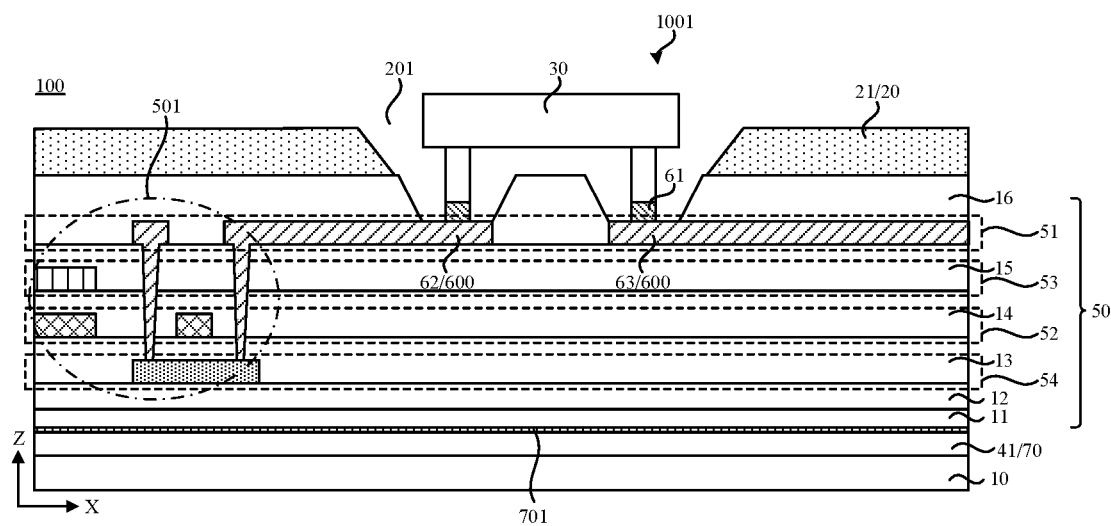
FIG. 31 is a structural diagram of a film layer of another light-emitting panel according to an embodiment of the present disclosure.

In an optional embodiment, as shown in FIG. 31, the light-emitting panel 100 may further include a reflective glass layer 70, where the reflective glass layer 70 may also include at least part of the second reflective portion 41.

The reflective glass layer 70 generally has good insulation property, electrostatic charges are not accumulated on the reflective glass layer 70, and the reflective glass layer 70 may have relatively low density so that the stress applied by the reflective glass layer 70 to the film layer (for example, the base substrate 10) below the reflective glass layer 70 is relatively small. In this case, the reflective glass layer 70 may be a whole-surface structure. In an optional embodiment, the reflective glass layer 70 may also be a block-shaped structure, so as to further reduce the stress applied to the film layer (for example, the base substrate 10) below the reflective glass layer 70 on the premise of satisfying requirements of reflecting light.

In an embodiment, as shown in FIG. 31, the reflective glass layer 70 may be a glass layer coated with a reflection enhancement film 701 on a surface of a side facing away from the base substrate 10. In an embodiment, as shown in FIG. 32, the reflective glass layer 70 may be a glass layer provided with a reflective structure 702 on a surface of a side facing away from the base substrate 10, which is not specifically limited in the embodiments of the present disclosure.

Figure 32:
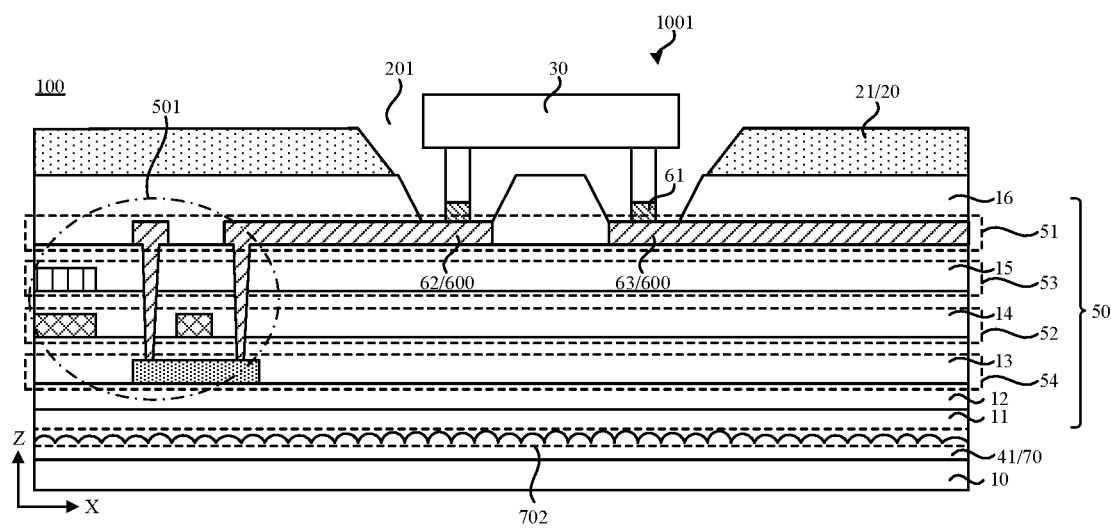
FIG. 32 is a structural diagram of a film layer of another light-emitting panel according to an embodiment of the present disclosure.

It is to be understood that, by way of example, FIGS. 31 and 32 only show that the reflective glass layer 70 is located between the base substrate 10 and the driver circuit layer 50, and in the embodiments of the present disclosure, the reflective glass layer 70 may be configured in the same manner as the second reflective layer, which is not specifically limited in the embodiments of the present disclosure. For the same part, reference may be made to the preceding description of the second reflective layer, which is not repeated herein.

Based on the same inventive concept, an embodiment of the present disclosure further provides a display device. The display device includes the light-emitting panel provided in the embodiments of the present disclosure. Therefore, the display device provided in the embodiment of the present disclosure has the technical features of the light-emitting panel provided in the embodiments of the present disclosure and can achieve the beneficial effects of the light-emitting panel provided in the embodiments of the present disclosure. For the same part, reference may be to the preceding description of the light-emitting panel provided in the embodiments of the present disclosure, which is not repeated herein.

Figure 33:
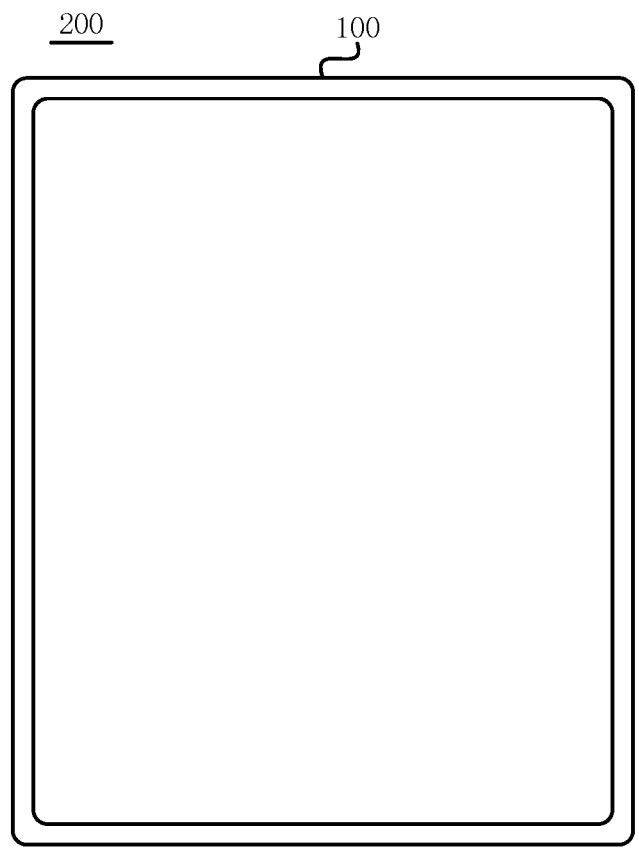
FIG. 33 is a structural diagram of another display device according to an embodiment of the present disclosure.

By way of example, FIG. 33 is a structural diagram of a display device according to an embodiment of the present disclosure. As shown in FIG. 33, a display device 200 includes the light-emitting panel 100 and may be a mobile phone, a tablet computer, a smart wearable device (for example, a smart watch) and other display devices known to those skilled in the art, which is not limited in the embodiments of the present disclosure.

The above-mentioned specific embodiments do not constitute a limitation on the protection scope of the present disclosure. It is to be understood by those skilled in the art that various modifications, combinations, sub-combinations and substitutions may be performed according to design requirements and other factors. Any modifications, equivalent replacements, improvements and the like within the spirit and principle of the present disclosure shall fall within the protection scope of the present disclosure.

What is claimed is:

1. A light-emitting panel, comprising:
   a base substrate;
   a first reflective layer located on the base substrate and a plurality of light-emitting elements located on the base substrate, wherein the first reflective layer comprises a first reflective portion and a plurality of hollow portions; a light-emitting element of the plurality of light-emitting elements is located in a hollow portion of the plurality of hollow portions and a gap exists between the light-emitting element in the hollow portion and the first reflective portion; and
   at least one second reflective portion located between the base substrate and the first reflective layer, wherein in a direction perpendicular to a plane where the base substrate is located, the at least one second reflective portion covers the gap;
   wherein the light-emitting panel comprises a plurality of second reflective portions corresponding to the plurality of hollow portions, two adjacent ones of the plurality of second reflective portions are not connected to each other;
   a height of the light-emitting element in the direction perpendicular to the plane where the base substrate is located is H1, and a minimum width of the gap between the light-emitting element and the first reflective portion along a first direction is d1, a distance between a surface of a side of a second reflective portion of the plurality of second reflective portions facing away from the base substrate and a surface of a side of the light-emitting element facing away from the base substrate is H2;
   the first direction is parallel to the plane where the base substrate is located; and
   along the first direction, a shortest distance d2 between the light-emitting element and an edge of the second reflective portion is at least (d1/H1)*H2.

2. The light-emitting panel of claim 1, wherein in the direction perpendicular to the plane where the base substrate is located, the second reflective portion further overlaps the light-emitting element or the first reflective portion on two sides of the gap.

3. The light-emitting panel of claim 1, further comprising a driver circuit layer located between the base substrate and the plurality of light-emitting elements, wherein the driver circuit layer comprises a plurality of driver circuits; and a driver circuit of the plurality of driver circuits is electrically connected to the light-emitting element and configured to drive the light-emitting element to emit light;
   wherein the light-emitting panel further comprises a second reflective layer located between the base substrate and the plurality of light-emitting elements;
   wherein the second reflective layer comprises at least part of the plurality of second reflective portions;
   wherein the driver circuit layer comprises at least one metal layer, and the at least one metal layer comprises at least portion of each of the plurality of driver circuits; and
   wherein reflectivity of the second reflective layer is greater than reflectivity of the at least one metal layer.

4. The light-emitting panel of claim 3, wherein the at least one metal layer comprises a first metal layer; and
   the second reflective layer is located between the first metal layer and the base substrate.

5. The light-emitting panel of claim 4, wherein the first metal layer further comprises part of the plurality of second reflective portions; and
   in the direction perpendicular to the plane where the base substrate is located, at least one second reflective portion located on the first metal layer and at least one second reflective portion located on the second reflective layer do not overlap each other.

6. The light-emitting panel of claim 5, wherein the at least one metal layer further comprises a second metal layer mutually insulated from the first metal layer; and the second reflective layer is located between the first metal layer and the second metal layer;
   wherein the second metal layer comprises part of the plurality of second reflective portions; and
   in the direction perpendicular to the plane where the base substrate is located, at least part of second reflective portions located on the second metal layer overlap at least one second reflective portion located on the second reflective layer, and at least one second reflective portion located on the first metal layer overlaps at least one second reflective portion located on the second metal layer.

7. The light-emitting panel of claim 4, wherein the first metal layer comprises a signal line, wherein the signal line is electrically connected to the plurality of light-emitting elements and comprises at least one light-transmitting hole;
   in the direction perpendicular to the plane where the base substrate is located, the signal line overlaps at least one second reflective portion located on the second reflective layer; and
   in the direction perpendicular to the plane where the base substrate is located, the at least one light-transmitting hole overlaps at least one second reflective portion located on the second reflective layer.

8. The light-emitting panel of claim 7, further comprising a connection electrode between the plurality of light-emitting elements and the first metal layer; and the plurality of light-emitting elements are electrically connected to the signal line through the connection electrode.

9. The light-emitting panel of claim 8, wherein in the direction perpendicular to the plane where the base substrate is located, the connection electrode overlaps the signal line; and
   along the first direction, a shortest distance between the connection electrode and the at least one light-transmitting hole is d3, and a shortest distance between the connection electrode and an edge of the signal line is d4; wherein d3≥d4;
   a distance between a surface of a side of the light-emitting element facing away from the base substrate and a surface of a side of the first reflective layer facing toward the base substrate is h1; and a distance between the surface of the side of the light-emitting element facing away from the base substrate and a surface of a side of the first metal layer facing away from the base substrate is h2;
   among the connection electrode and the plurality of light-emitting elements electrically connected to each other, and a distance along the first direction between a side of the connection electrode closer to the first reflective portion and a side of the light-emitting element closer to the first reflective portion is d5; and
   along the first direction, a value range of a length d6 of each of the at least one light-transmitting hole satisfies that d6≥ (d5−d3+ (d1/h1)*h2).

10. The light-emitting panel of claim 7, wherein in a case where the signal line comprises a plurality of light-transmitting holes, the plurality of light-transmitting holes are arranged at intervals along a second direction in sequence;
    wherein the second direction is parallel to the base substrate.

11. The light-emitting panel of claim 10, wherein a width w of each of the plurality of light-transmitting holes in the second direction satisfies that w≥1 μm.

12. The light-emitting panel of claim 3, wherein each of the plurality of driver circuits comprises at least one transistor;
    the driver circuit layer further comprises a semiconductor layer, wherein the semiconductor layer comprises an active layer of the at least one transistor;
    the second reflective layer is located between the semiconductor layer and the base substrate; and
    in the direction perpendicular to the plane where the base substrate is located, the plurality of second reflective portions and the active layer do not overlap each other.

13. The light-emitting panel of claim 3, wherein the second reflective layer is a metal reflective layer; the driver circuit layer comprises the second reflective layer; the second reflective layer and the at least one metal layer are insulated from each other; and the second reflective layer further comprises part of a structure of each of the plurality of driver circuits.

14. The light-emitting panel of claim 3, wherein the second reflective layer is located between the driver circuit layer and the plurality of light-emitting elements;
    wherein the at least one metal layer further comprises part of the plurality of second reflective portions, and
    in the direction perpendicular to the plane where the base substrate is located, at least one second reflective portion located on the at least one metal layer overlaps at least one second reflective portion located on the second reflective layer.

15. The light-emitting panel of claim 1, further comprising a reflective glass layer;
    wherein the reflective glass layer comprises at least part of the plurality of second reflective portions.

16. The light-emitting panel of claim 1, wherein a material of the plurality of second reflective portions comprises at least one of silver or aluminum.

17. The light-emitting panel of claim 1, wherein the first reflective layer comprises white ink.

18. A display device, comprising a light-emitting panel;
    wherein the light-emitting panel comprises:
    a base substrate;
    a first reflective layer located on the base substrate and a plurality of light-emitting elements located on the base substrate, wherein the first reflective layer comprises a first reflective portion and a plurality of hollow portions; a light-emitting element of the plurality of light-emitting elements is located in a hollow portion of the plurality of hollow portions and a gap exists between the light-emitting element in the hollow portion and the first reflective portion; and
    at least one second reflective portion located between the base substrate and the first reflective layer, wherein in a direction perpendicular to a plane where the base substrate is located, second reflective portion covers the gap;
    wherein the light-emitting panel comprises a plurality of second reflective portions corresponding to the plurality of hollow portions, two adjacent ones of the plurality of second reflective portions are not connected to each other;

a height of the light-emitting element in the direction perpendicular to the plane where the base substrate is located is H1, and a minimum width of the gap between the light-emitting element and the first reflective portion along a first direction is d1, a distance between a surface of a side of a second reflective portion of the plurality of second reflective portions facing away from the base substrate and a surface of a side of the light-emitting element facing away from the base substrate is H2;

the first direction is parallel to the plane where the base substrate is located; and along the first direction, a shortest distance d2 between the light-emitting element and an edge of the second reflective portion is at least (d1/H1)*H2.

* * * * *